(12) United States Patent
Wood et al.

(10) Patent No.: US 7,145,143 B2
(45) Date of Patent: Dec. 5, 2006

(54) TUNABLE SENSOR

(75) Inventors: Roland A. Wood, Bloomington, MN (US); Barrett E. Cole, Bloomington, MN (US); Robert E. Higashi, Shorewood, MN (US); Daniel W. Youngner, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 289 days.

(21) Appl. No.: 10/749,710

(22) Filed: Dec. 31, 2003

(65) Prior Publication Data

US 2004/0217264 A1 Nov. 4, 2004

Related U.S. Application Data

(63) Continuation-in-part of application No. 10/100,298, filed on Mar. 18, 2002.

(51) Int. Cl.
  *G01B 9/02* (2006.01)
  *G01J 3/45* (2006.01)
(52) U.S. Cl. .................................. 250/339.04
(58) Field of Classification Search ........... 250/339.04, 250/339.02, 339.03, 339.01, 341.8; 356/352
See application file for complete search history.

(56) References Cited

U.S. PATENT DOCUMENTS

| | | | |
|---|---|---|---|
| 4,654,622 A | 3/1987 | Foss et al. | |
| 4,726,071 A * | 2/1988 | Jachowski | 455/125 |
| 5,483,387 A | 1/1996 | Bauhahn et al. | |
| 5,550,373 A | 8/1996 | Cole et al. | |
| 5,995,235 A * | 11/1999 | Sui et al. | 356/419 |
| RE36,706 E | 5/2000 | Cole | |
| 6,147,756 A * | 11/2000 | Zavracky et al. | 356/519 |
| 6,222,454 B1 * | 4/2001 | Harling et al. | 340/584 |
| 6,236,047 B1 * | 5/2001 | Malin et al. | 250/339.12 |
| 6,392,775 B1 | 5/2002 | Drake et al. | |
| 6,483,130 B1 | 11/2002 | Yang et al. | |
| 6,576,904 B1 | 6/2003 | Volkening | |
| 6,597,461 B1 * | 7/2003 | Verma et al. | 356/519 |
| 6,627,892 B1 | 9/2003 | Cole | |
| 6,718,086 B1 * | 4/2004 | Ford et al. | 385/27 |
| 2002/0018385 A1 * | 2/2002 | Flanders et al. | 365/215 |
| 2002/0159672 A1 * | 10/2002 | Fells et al. | 385/13 |
| 2003/0197124 A1 | 10/2003 | Wood | |
| 2003/0219204 A1 * | 11/2003 | Yeralan et al. | 385/37 |

* cited by examiner

*Primary Examiner*—Otilia Gabor
(74) *Attorney, Agent, or Firm*—Kris T. Fredrick

(57) ABSTRACT

A tunable bolometer device for detecting infrared light (IR) from a target at specific frequencies and in a broadband mode. The device may have an array of pixels of which each is controllable to be sensitive to a particular wavelength of light that is selected and detected. The detection of particular frequencies on a pixel level may result in spectral analysis of the target. Further, each pixel of the bolometer via an associated etalon may be tuned to detect a different frequency of IR or be switched to broadband detection of IR. The device may be packaged in an integrated vacuum package where the etalon array becomes the topcap which is bonded to the wafer containing the bolometer array.

35 Claims, 39 Drawing Sheets

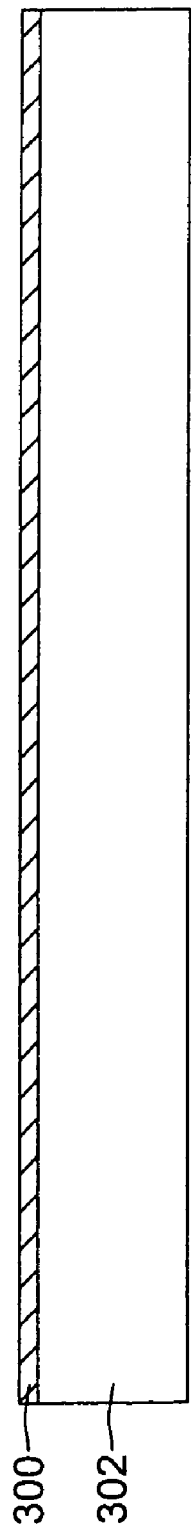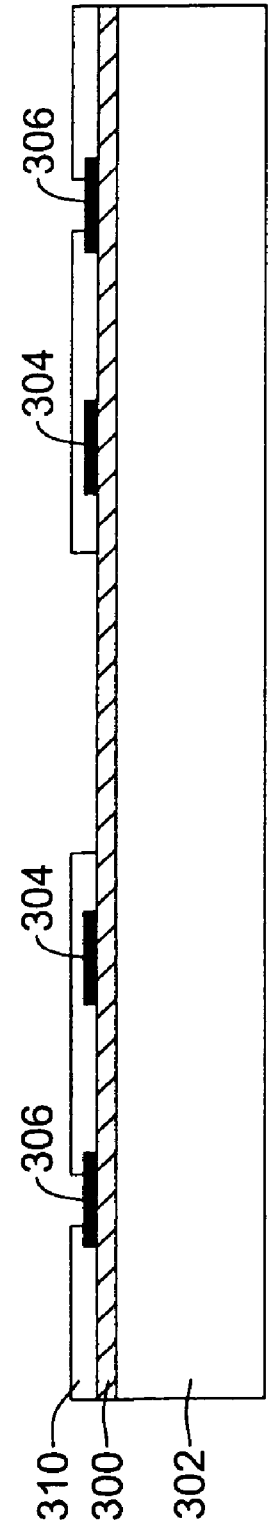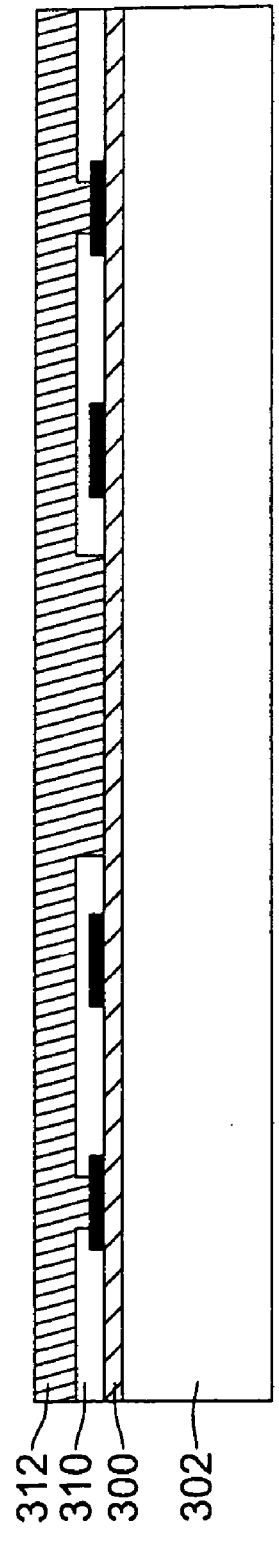
Figure 12A
Figure 12B
Figure 12C

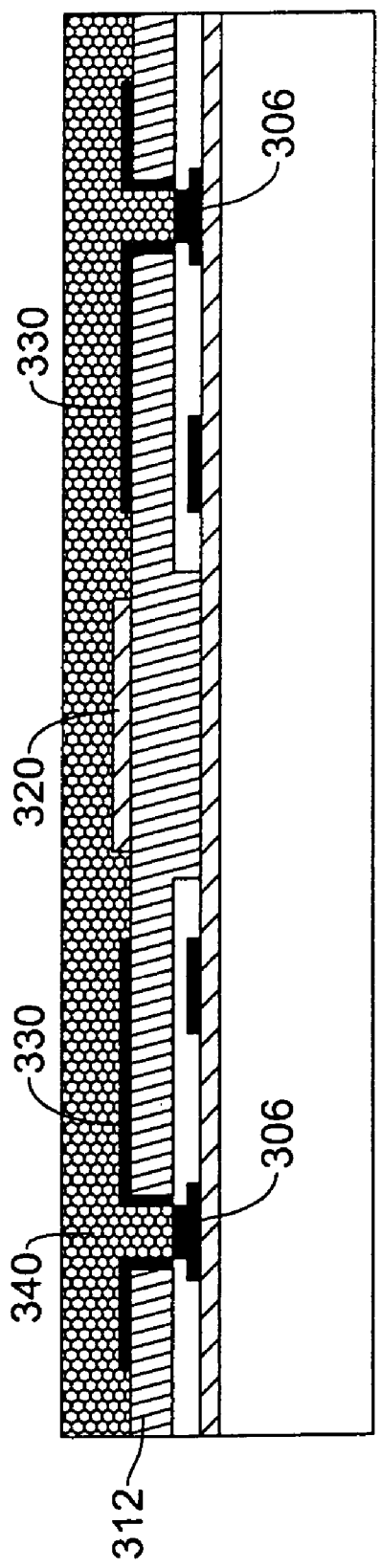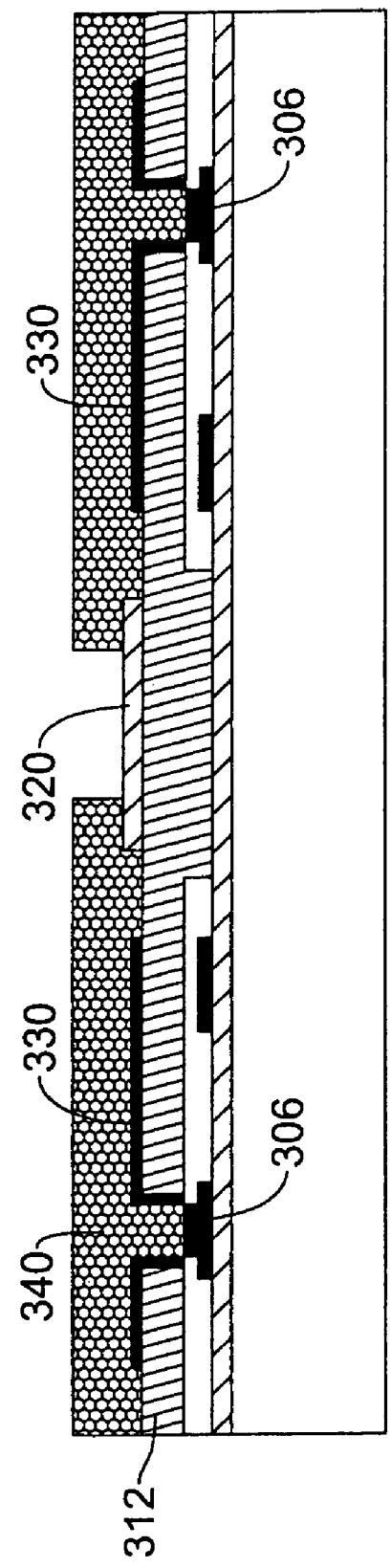

MEMS Actuator Array

MEMS Actuator Array Unit Cell

TUNABLE SENSOR

The present application is a continuation-in-part of U.S. patent application Ser. No. 10/100,298, filed Mar. 18, 2002, by B. Cole et al., and entitled, "Spectrally Tunable Detector".

The present description is related to U.S. Pat. No. 6,621, 083 B2, U.S. Pat. No. 6,627,892 B2, and U.S. Pat. No. 5,550,373. U.S. Pat. No. 6,621,083 B2, issued Sep. 16, 2003, to B. Cole and entitled, "High-Absorption Wide-Band Pixel for Bolometer Arrays," is hereby incorporated by reference in the present specification. U.S. Pat. No. 6,627,892 B2, issued on Sep. 30, 2003, to B. Cole and entitled, "Infrared Detector Packaged with Improved Antireflection Element," is hereby incorporated by reference in the present specification. U.S. Pat. No. 5,550,373, issued on Aug. 27, 1996, to B. Cole et al. and entitled, "Fabry-Perot Micro Filter-Detector," is hereby incorporated by reference in the present specification.

BACKGROUND

The present invention relates to detectors and particularly to infrared (IR) detectors. More particularly, the invention relates to tunable IR detectors.

A desired feature of an infrared (IR) detector not apparent in the related art is the flexibility of looking at certain narrow bandwidth and then also looking at broadband IR light.

SUMMARY

The invention may have pixels that have a tunable spectral bandpass in a broader range and selected pixels that may operate in a tunable narrow band range at certain bandwidths. For example, this invention may effectively enable spectral analysis of a thermal emission from a target to aid in identification of the nature of the target.

BRIEF DESCRIPTION OF THE DRAWING

FIGS. 12A–12I are schematic cross-sectional side views showing another illustrative method for making a tunable bandpass filter;

DESCRIPTION

Figure 1:
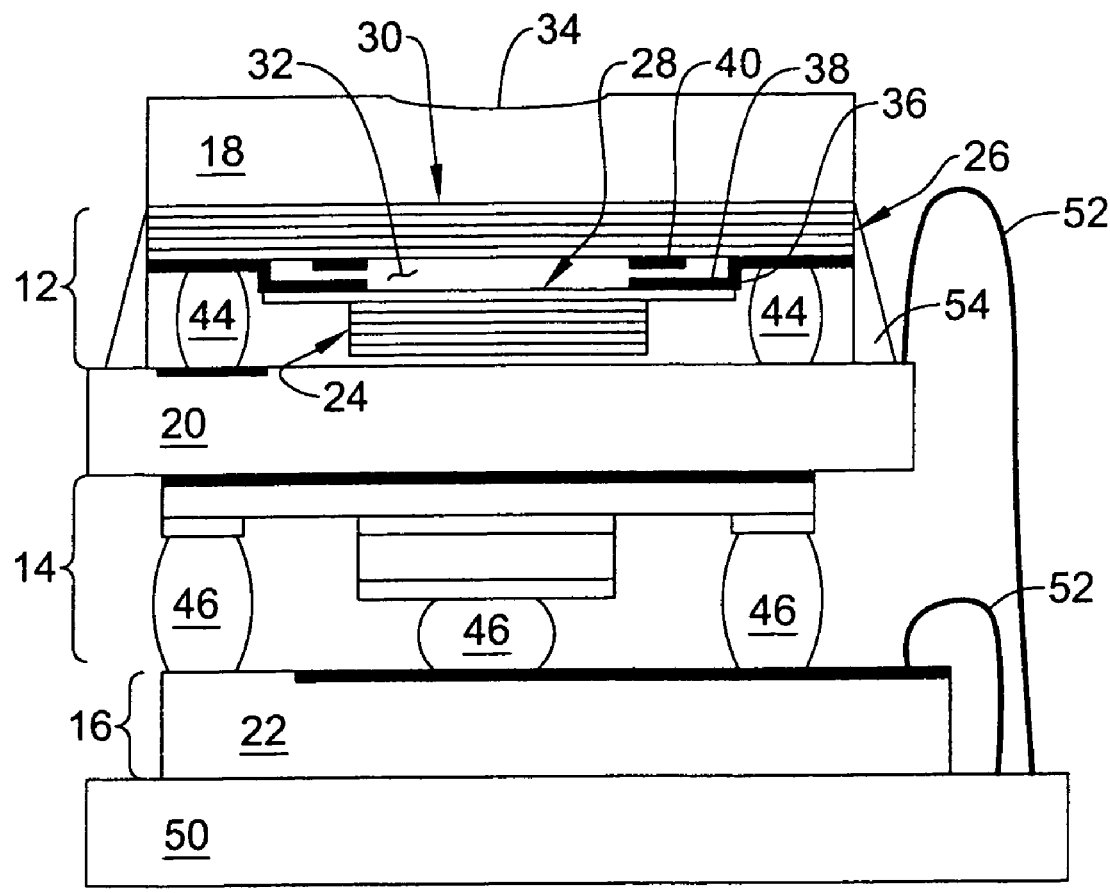
FIG. 1 is a schematic cross-sectional side view of an illustrative tunable bandpass detector.

The present invention may be an adaptive uncooled focal plane operates in a broadband mode, and have selected pixels that can operate in a tunable narrowband mode. The latter may provide spectral analysis of thermal emission from targets to aid in identification of the nature of the target. It may allow the using selected targets, while also allowing high-sensitivity broadband thermal imaging with an uncooled array. In other words, the invention may allow both broadband and narrow band tuning on an individual pixel array basis. It is an uncooled technology, suitable for lightweight low-loss IR systems. The array may have a tunable spectral band pass (e.g., tunable Fabry-Perot IR array) in the broader band pass range of an uncooled bolometer detector operating from 8 to 12 microns. Another operating range may be from 3 to 5 microns. There may be other operating ranges. Fabry-Perot device may operate as an adjustable IR light band pass filter.

A pixelated tunable Fabry-Perot (FP) etalon may be affixed just above a microbolometer array. The FP etalons may be individually adjustable with electrostatic actuators. Narrow band operation may be obtained in an FP manner. A collapse of the FP etalons to zero-optical gap may allow broadband IR imaging. All FP etalons may be addressable with a monolithic control integrated circuit. The tunable etalon array may be fabricated as a separate silicon chip to the underlying microbolometer array, allowing optimization with few constraints. The tunable etalon array may be incorporated into the vacuum topcap of an integrated vacuum package. The etalon chip and the microbolometer chip may have individual integrated circuits. The two chips may be bonded either die-to-die or wafer-to-wafer.

The device may consist of a three level array having a bottom level containing the CMOS and a multilayer reflector, a middle level being a stationary pixel with a thin absorbing region; and a top level being a multilayer mirror similar to that of the bottom mirror. The mirror may be moved through a quarter wave optical distance and at each position provide an absorption in a 0.5 micron wide region of the 8–12 micron band. The voltage to actuate the top mirror which contains an electrode may be provided by either through the substrate or through the integrated vacuum package window. The IR array may be a form-fit replacement for existing arrays with the added need to incorporate FP mirror actuation voltages either into the top-cap window or onto the CMOS circuitry.

A gas sensor which relies on sensing infrared gas absorption may use a low-cost adaptive (i.e., wavelength tunable) IR sensor or emitter with a defined-band IR response that can be tuned on and off the absorbing band of the gas. A desirable tuning range may be the 3–5 micron wavelength. This tuning ability may allow the IR system to substantially reject changes the brightness of the IR source, obscuration of the optical path by dust, drifts in the sensitivity of the IR sensor and DC drifts in the electronic system, allowing the gas sensor to have a long-lived stable performance. Such gas sensor may be a low-cost device to produce the desired tuning in both the 3–5 and 8–12 micron bands. IR temperature sensors for non-gray bodies may also use IR sensors with a convenient structure of measuring radiance at two or more different wavelengths, and this sensor may also provide this in a low-cost manner.

A feature of the invention is the integration of a long wave IR device into a single die with both a detector and a Fabry-Perot tuning structure. The present system may be a long-wave adaptive micro bolometer detector array (LAMDA). It may be an integrated pixel tunable focal plane array providing uncooled imaging and individual pixel spectral specificity. The micro bolometer detector array may have embedded driving electronics. There may be a tunable etalon array (TEA) with monolithic drive electronics. Each pixel of this array may be electrically configurable to detect either broad-band long wave infrared radiation (LWIR, 8 to 12 microns) or narrow-band radiation with a resolution of 0.3 to 0.5 micron full width half maximum (FWHM) at typical imaging system frame rates. Thus, the system may be capable of imaging in two modes: broadband for general review or survey and narrow-band for detailed spectral interrogation of a discovered target. This uncooled IR imaging system may be a near drop-in replacement of the conventional micro bolometer detector array (MBDA).

Several features of the system may include thin-film IR etalon structure, the broadband node, electrostatic actuation of etalon structures, monolithic control integrated circuits (CICs) for addressable etalons, wafer level assembly, precise cell alignment and etalon-bolometer coupling. Fabrication process of the system may be carried out on a wafer scale assembly.

Various configurations of thin film electrical and optical materials may provide multiple-optically coupled moving resonators for improved optical performance. Etalon thin film optical components may be composed of a few simple films, e.g., Si, or Ge, that are tailored to achieve the desired mechanical and optical performance.

In addition to achieving spectral signatures due to the narrow-band IR detection, the system array may be operated in the broadband mode making the system nearly as sensitive as a standard bolometer.

The electrostatic actuated array may achieve precision movement of an individual, resulting in narrow-band tuning and broadband operation as desired. Actuation based on flexible smooth-bending legs may provide actuation over a large range to avoid the typical capacitive snapping capacitor limitation of about one-third of the full range.

The present monolithic high/voltage CICs may provide for efficient optical transmission and individual control of the tunable etalon array pixels at rates much faster than image frame rates.

FIG. 1 is a schematic cross-sectional side view of an illustrative tunable bandpass detector 10. The illustrative tunable bandpass detector 10 may include a tunable bandpass filter 12, a detector 14 and readout electronics 16, each supported by a different substrate. For example, the tunable bandpass filter 12 may be supported by a first substrate 18, the detector 14 may be supported by a second substrate 20, and the readout electronics 16 may be supported by a third substrate 22.

In the illustrative embodiment, the tunable bandpass filter 12 may include a Micro Electro Optical Mechanical System (MEOMS) etalon. The MEOMS may include a top plate 24 and a bottom plate 26. The bottom plate 26 may correspond to the first substrate 18, or other layers provided on the first substrate 18, as desired. Both the top plate 24 and the bottom plate 26 may be adapted to include a reflective region. In FIG. 1, the top plate includes a reflective region 28, which may include for example a Distributed Bragg reflector that includes a semiconductor and/or dielectric mirror stack. Alternatively, the reflective region 28 may simply include one or more metal layers, such as an aluminum layer. It should be recognized that these are only illustrative, and that the reflective region 28 may be made from any suitable material or material system that provides the desired reflectivity. Like the top plate, the bottom plate 26 may include a reflective region 30, which like above, may be made from any suitable material or material system that provides the desired reflectivity.

The top plate 24 and the bottom plate 26 may be separated by a separation gap 32 to form a Fabry-Perot cavity. To selectively tune the tunable bandpass filter 12 to a desired bandpass wavelength, the top plate may be pulled toward the bottom plate 26, which changes the separation gap 32. The range of movement of the top plate 24 relative to the bottom plate 26 may determine the spectral range of the wavelengths that can be selected. In some embodiments, a lens 34 may be positioned adjacent the tunable bandpass filter 12 to help direct and/or shape the incoming light beam.

In one embodiment, the top plate 24 may be suspended above the bottom plate 26 by one or more supporting legs and/or posts 36. In addition, one or more top electrodes 38 may be mechanically coupled to the top plate 24, and one or more bottom electrodes 40 may be mechanically coupled to the bottom plate 26. When an electric potential is applied between corresponding top electrodes 38 and bottom electrodes 40, an electrostatic force may be generated to pull the top plate 24 toward the bottom plate 26. This may change the separation gap 32 of the Fabry-Perot cavity. In some embodiments, the electrostatic force may cause one or more supporting legs 36 to deform to provide the movement of the reflective region 28 of the top plate 24 relative to the bottom plate 26. The reflective region 28 may be relatively rigid to help prevent curvature across the reflective region 28 when actuated.

The detector 14 may be disposed adjacent the tunable bandpass filter 12, and receives the one or more wavelengths that are passed through the tunable bandpass filter 12. The detector 14 may be sensitive to the entire spectral range of wavelengths that can be passed through the tunable bandpass filter 12. In an illustrative embodiment, the detector 14 may be an AlGaN PIN photodiode, such as described in U.S. Pat. No. 6,483,130 B1, issued Nov. 19, 2002, to W. Yang et al., and entitled "Back-Illuminated Heterojunction Photodiode", which is hereby incorporated by reference in the present description.

In the illustrative example shown in FIG. 1, the tunable bandpass filter 12 may be supported by the first substrate 18, and the detector 14 may be supported by a second substrate 20. The first and second substrates may be substantially transparent to the expected spectral range of wavelengths. The first substrate may be selected for its transmission properties allowing only the proper range of wavelengths to be transmitted. In one illustrative embodiment, the first substrate may be Pyrex and the second substrate may be sapphire. The first and second substrates may be secured together in a front-to-back fashion, as shown in FIG. 1. That is, the front side of the first substrate 18 may be provided adjacent to the back side of the second substrate 20. Bump bonds 44 or the like may be used to secure the first substrate 18 to the second substrate 20, and to make any electrical connection therebetween, as desired. A dielectric seal 54 may be provided as shown to protect the tunable bandpass filter 12. In some embodiments, the dielectric seal 54 may provide a vacuum seal. Arranged in this manner, the wavelengths of interest may pass, in sequence, through the first substrate 18, the bandpass filter 12, and the second substrate 20, before reaching the detector 14.

Figure 2:
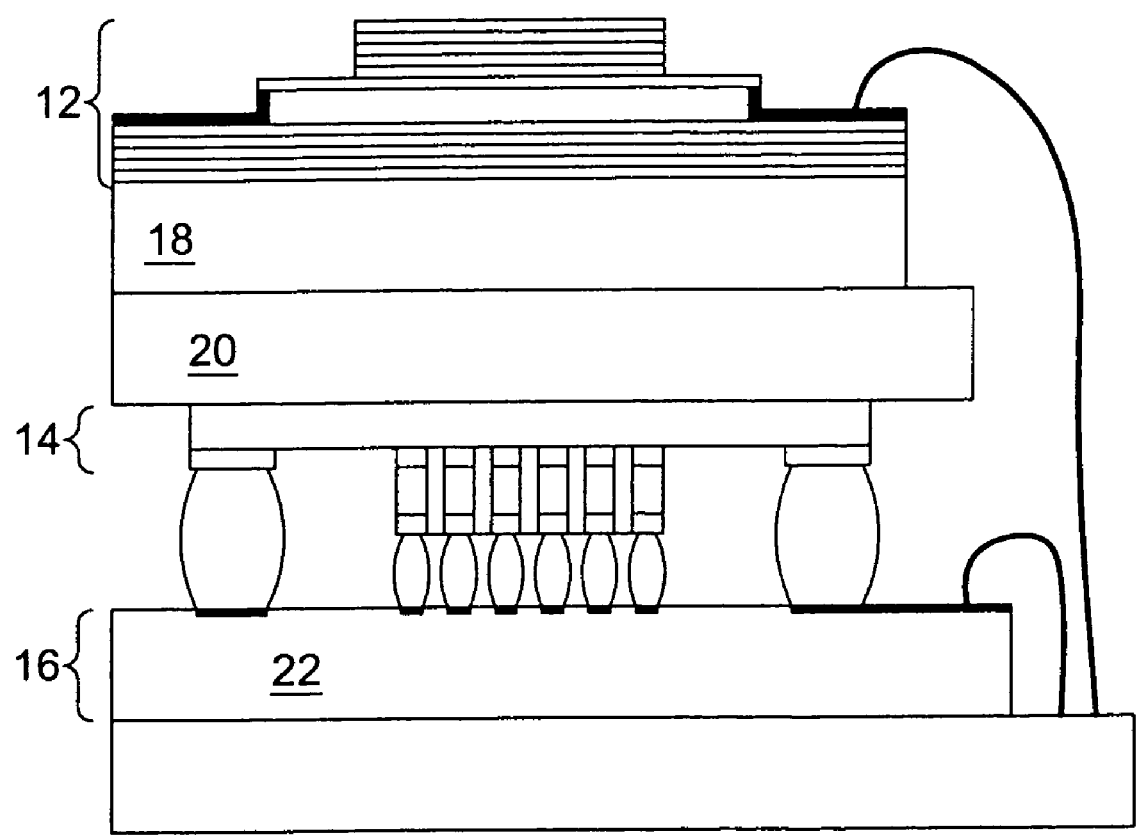
FIG. 2 is a schematic cross-sectional side view of another illustrative tunable bandpass detector.

Alternatively, and as shown in FIG. 2, the first and second substrates may be secured together in a back-to-back fashion. That is, the back side of the first substrate 18 may be secured to the back side of the second substrate 20. Arranged in this manner, the wavelengths of interest may pass, in sequence, through the tunable bandpass filter 12, the first substrate 18, and the second substrate 20, before reaching the detector or detectors 14. Other arrangements of the first and second substrates may also be contemplated, including a back-to-front arrangement and a front-to-front arrangement, as desired.

In some embodiments, readout electronics may be provided on a third substrate 22. The readout electronics may be fabricated using conventional integrated circuit processing techniques. For example, the readout electronics may be fabricated using a CMOS process on a silicon substrate 22. Metal pads may be provided to provide electrical connections to the detector 14. In the embodiment shown in FIG. 1, bump bonds 46 may be used to electrically connect one or more electrodes (usually combinations of each pixel and a common ground terminal) of the detector 14 to corresponding metal pads of the readout electronics. The bump bonds may also be used to secure the third substrate 22 relative to the second substrate 20, as shown. The third substrate may be mounted to a package 50, if desired. In the illustrative embodiment, bond wires 52 may be used to connect selected package pins to the readout electronics and the electrodes of the tunable bandpass filter 12, as shown.

FIG. 2 is a schematic cross-sectional side view of another illustrative tunable bandpass detector. The embodiment shown in FIG. 2 is similar to the embodiment shown in FIG. 1. However, unlike the embodiment of FIG. 1, the first and second substrates may be secured together in a back-to-back fashion. That is, the back side of the first substrate 18 may be secured to the back side of the second substrate 20. Arranged in this manner, the wavelengths of interest may pass, in sequence, through the tunable bandpass filter 12, the first substrate 18, and the second substrate 20, before reaching the detector(s) 14. Another difference may be that the detector 14 includes an array of detectors. Such an array of detectors 14 may be used to capture an array of pixels to form an image, rather than a single pixel as shown in FIG. 1. While FIGS. 1 and 2 show some illustrative methods to assemble various components to form a tunable bandpass filter, it should be recognized that any suitable method may be used, including those further described below.

Figure 3:
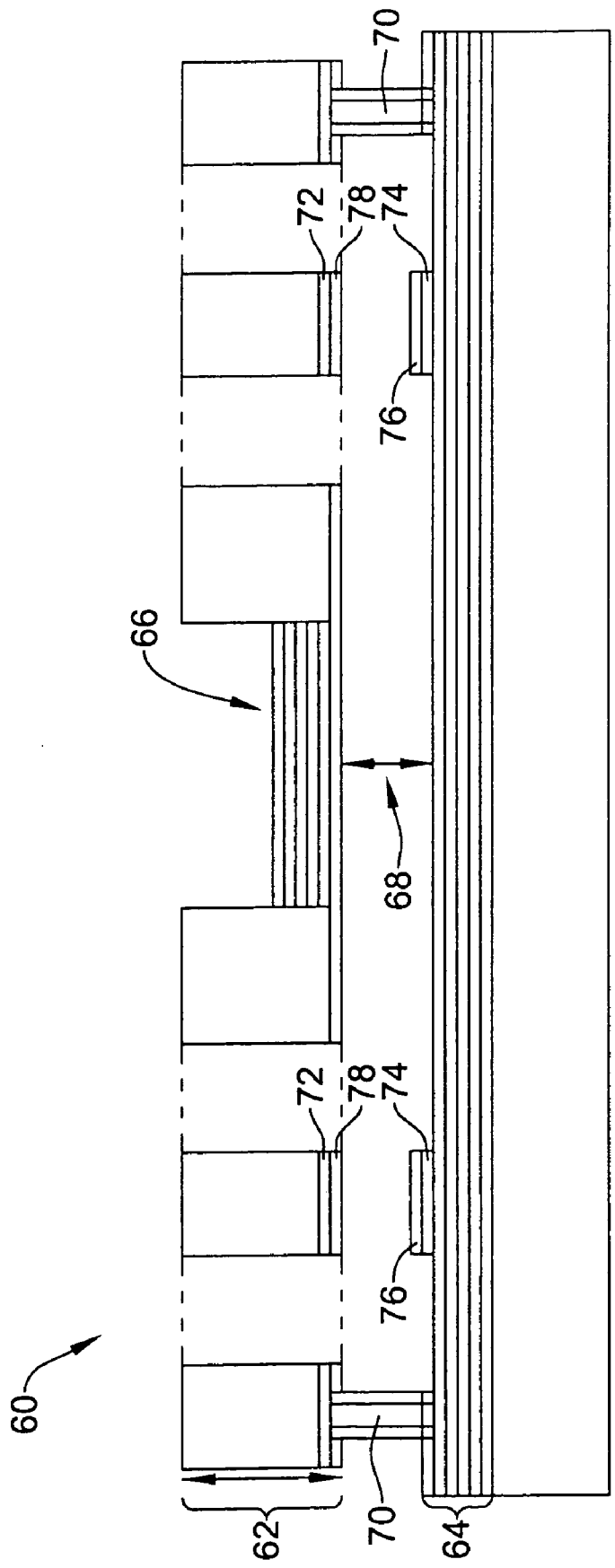
FIG. 3 is a schematic cross-sectional side view of another illustrative tunable bandpass filter.

FIG. 3 is a schematic cross-sectional side view of an illustrative tunable bandpass. The illustrative tunable bandpass filter 60 may include a top plate 62 and a bottom plate 64. Both the top plate 62 and the bottom plate 64 may be adapted to include a reflective region. In the illustrative embodiment, the top plate 62 may include a reflective region 66 which may include a Distributed Bragg reflector that has a semiconductor and/or dielectric mirror stack. Likewise, the bottom plate 64 may include a reflective region 30, which in the embodiment shown, may extend across the entire surface of the bottom plate 64 and may include a Distributed Bragg reflector that has a semiconductor and/or dielectric mirror stack. Alternatively, the reflective regions 66 and 64 may simply include one or more metal layers, such as an aluminum layer. It should be recognized that these are only illustrative, and that the reflective regions 66 and 64 may be made from any suitable material or material system that provides the desired reflectivity.

As discussed above, the top plate 62 and the bottom plate 64 may be separated by a separation gap 68 to form a Fabry-Perot cavity. To selectively tune the tunable bandpass filter 60 to a desired bandpass wavelength, the top plate 62 may be pulled toward the bottom plate 64, which changes the separation gap 68. The range of movement of the top plate 62 relative to the bottom plate 64 may determine the spectral range of the wavelengths of interest.

As shown in FIG. 3, the top plate 62 may be suspended above the bottom plate 64 by one or more supporting legs and/or posts 70. In addition, one or more top electrodes 72 may be mechanically coupled to the top plate 62, and one or more bottom electrodes 74 may be mechanically coupled to the bottom plate 64. The one or more top electrodes 72 may be in registration with the one or more bottom electrodes 74. A dielectric layer 76 may be provided over the one or more bottom electrodes 74, and/or a dielectric layer 78 may be provided over the one or more top electrodes 72. These dielectric layers may help protect the top and bottom electrodes from environmental conditions, and may help prevent a short when the top plate is fully actuated toward the bottom plate.

When an electric potential is applied between top electrodes 72 and bottom electrodes 74, an electrostatic force may be generated that pulls the reflective region 66 of the top plate 62 toward the bottom plate 64 to change the separation gap 68 of the Fabry-Perot cavity. In some embodiments, the electrostatic force may cause at least part of the supporting legs to at least temporarily deform to provide the necessary movement of the reflective region 66.

Figure 4:
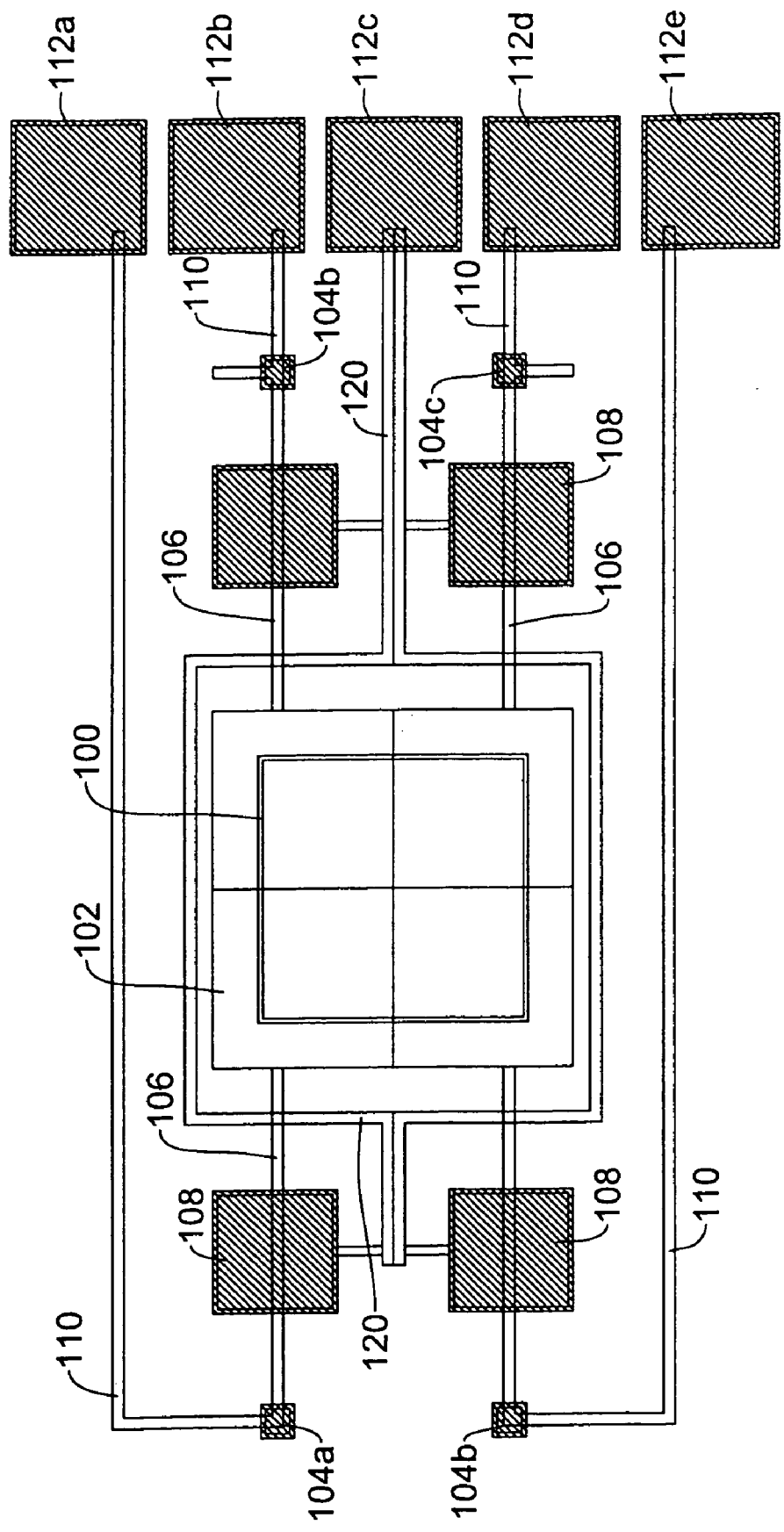
FIG. 4 is a layout of an illustrative bandpass filter.

FIG. 4 is a layout of an illustrative bandpass filter. The bottom substrate is not shown. The top plate may include a reflective region 100, which has for example a Distributed Bragg reflector with a semiconductor and/or dielectric mirror stack, one or more metal layers, or any other material or material system that provides the desired reflectivity. In one illustrative embodiment, the reflective region 100 may include a Distributed Bragg reflector that has a number of alternating layers of $ZrO_2/SiO_2$, $HfO_2/SiO_2$, or any other suitable material system. The bottom plate (not shown) also may have a reflective region that may be positioned below the reflective region 100 of the top plate to form a Fabry-Perot cavity therebetween.

In the illustrative embodiment, the reflective region 100 of the top plate may be secured to a top support member 102. The illustrative top support member 102 may have a ring that extends around and may be secured to the reflective region 100. In the illustrative embodiment, the top support member 102 also may include four thin supporting legs 106. The thin supporting legs 106 may be used to suspend the ring and reflective region 100 above the bottom plate. In the illustrative embodiment, the thin supporting legs may be mechanically secured to posts 104a–104d. Posts 104a–104d may extend upward from the bottom plate and support the top support member 102. The top support member may be, for example, $SiO_2$ or any other suitable material or material system.

Each thin supporting leg 106 may have an electrode region 108 that supports a top electrode, as shown. Each top electrode region 108 may have an interconnect line that extends along the corresponding supporting leg to a corresponding anchor or post 104. Each post 104a–104d may provide a conductive path that electrical connects the interconnect lines of the top electrodes to corresponding interconnect lines 110 on the bottom plate.

In the illustrative embodiment, the interconnect lines 110 on the bottom plate may electrically connect each of the posts 104a–104d to a corresponding pad 112a–112d, respectively. Rather than connecting the posts to corresponding pads, it is recognized that the interconnect lines 110 may electrically connect the posts 104a–104d to one or more driving circuits, if desired. In addition, it is contemplated that the interconnect lines may be electrically tied together so that all of the top electrodes are commonly driven.

Bottom electrodes may be positioned below each of the top electrodes. In the example shown, interconnect lines 120 may electrically connect each of the bottom electrodes to a single pad 114. Thus, in the illustrative embodiment, all of the bottom electrodes may be commonly driven. However, this is not required.

To tune the illustrative bandpass filter to a desired band of wavelengths, an electrical potential may be provided between the bottom electrodes and the top electrodes. When an electric potential is applied in such a manner, an electrostatic force may be generated that pulls the electrode region 108 of the top plate toward the bottom plate to change the separation gap of the Fabry-Perot cavity. In some embodiments, the electrostatic force may cause the supporting legs 106 of the top support plate 102 to deform to provide the necessary movement of the reflective region 100. The top support member 102 may be relatively rigid to help prevent curvature across the reflective region 100 when actuated.

Figure 5:
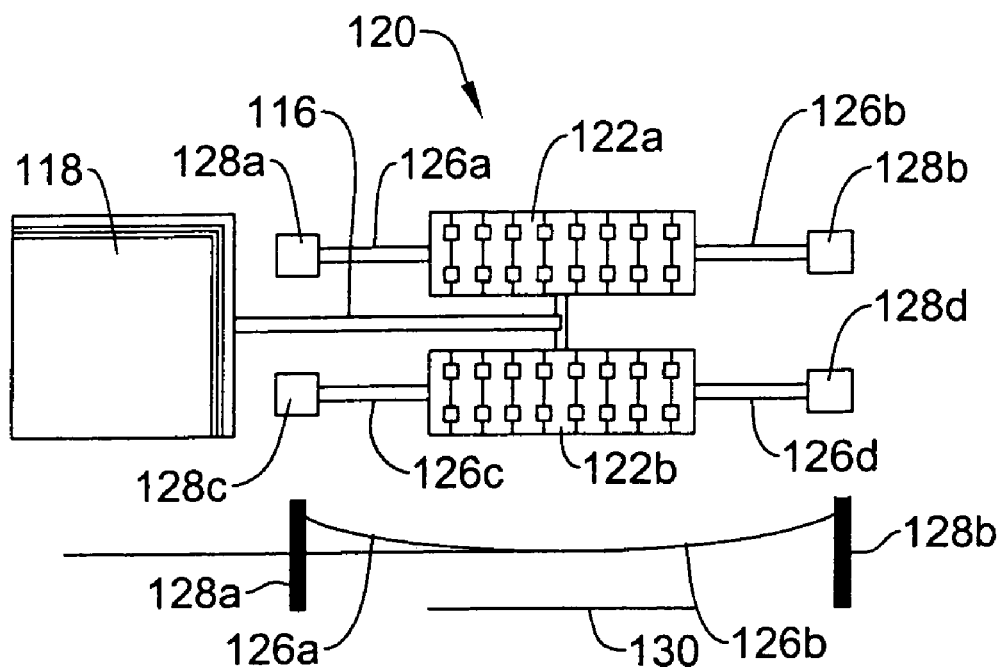
FIG. 5 is a layout showing a support leg, posts and top and bottom electrodes of another illustrative bandpass filter.

FIG. 5 is a layout showing a support leg 116, posts 128a–128d and top and bottom electrodes of another illustrative bandpass filter. In this illustrative embodiment, support leg 116 is shown with one end attached to the top support member 118 of a top reflective region, and the other end attached to a bridge portion 124 of a top electrode 120. The illustrative top electrode 120 may be "H" shaped with a first electrode leg portion 122a and a second electrode leg portion 122b connected by a bridge portion 124. The first electrode leg portion 122a may be suspended above a bottom plate by elongated supporting legs 126a and 126b, which are connected to posts 128a and 128b, respectively. The second electrode leg portion 122b may be suspended in a similar manner.

When a potential is applied between the first and second electrode leg portions 122a and 122b and a corresponding bottom electrode 130, the elongated supporting legs 126a–126d may deform at least temporarily down toward the bottom plate 130. Because the supporting leg 116 may be connected to the bridge portion 124, which is situated at a central location with respect to the first and second electrode leg portions 122a and 122b, the supporting leg 116 may not substantially deform when providing movement to the top support member 118. This may help reduce any deformation of the top support member 118 when the top support member 118 is moving from an upward position toward the bottom plate.

Figure 6:
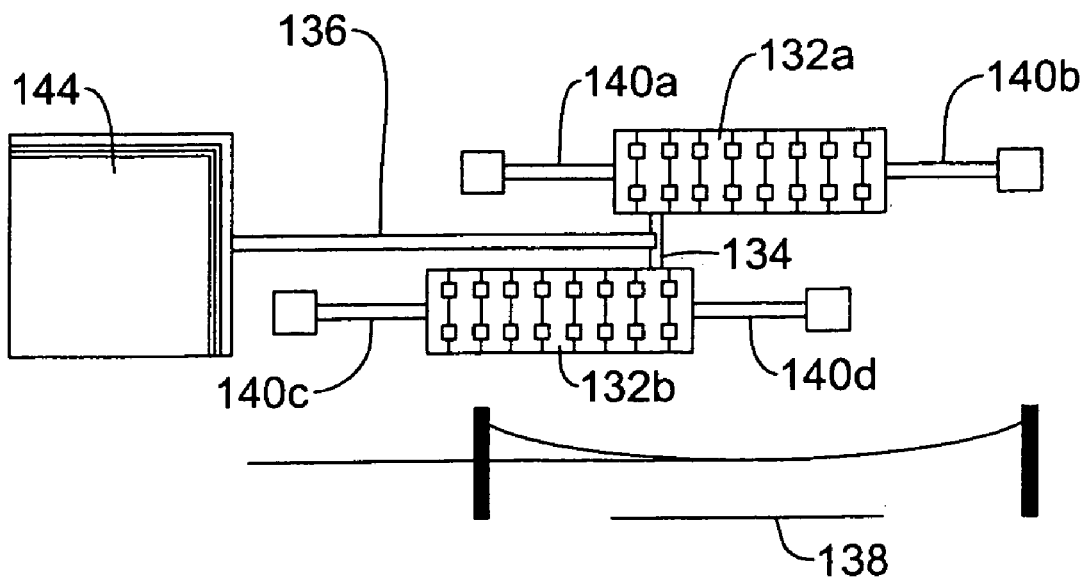
FIG. 6 is a layout showing a support leg, posts and top and bottom electrodes of yet another illustrative bandpass filter.

FIG. 6 is a layout showing a support leg 136, posts and top and bottom electrodes of yet another illustrative bandpass filter. In this illustrative embodiment, the top electrode may include a first electrode portion 132a and a second electrode portion 132b, which are offset relative to one another as shown. Support leg 136 is shown with one end attached to the top support member 144 of a top reflective region, and the other end attached to a bridge portion 134 of a top electrode 132. The bridge portion 134 may connect two adjacent ends of the first electrode portion 132a and the second electrode portion 132b, as shown.

When a potential is applied between the first and second electrode portions 132a and 132b and a corresponding bottom electrode 138, the elongated supporting legs 140a–140d may deform at least temporarily down toward the bottom plate. In this embodiment, an intermediate part of the first and second electrode portions 132a and 132b may snap down, and in some embodiments, may actually engage the bottom electrode 138. As more potential is then applied, the first and second electrode portions 132a and 132b may begin to roll down toward the bottom electrode 138, which lowers the position of the supporting leg 136 and the support member 144. This rolling action may provide greater control over the movement of the top support member 144 relative to the bottom plate.

Figure 7:
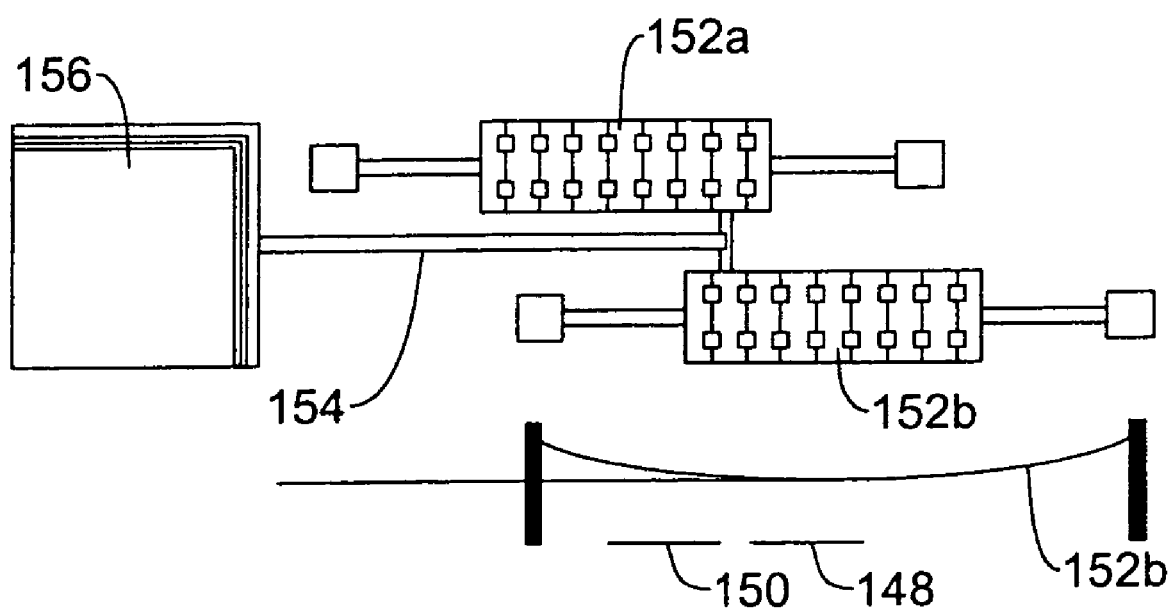
FIG. 7 is a layout showing a support leg, posts and top and bottom electrodes of another illustrative bandpass filter.

FIG. 7 is a layout showing a support leg, posts and top and bottom electrodes of another illustrative bandpass filter. FIG. 7 is similar to the embodiment shown in FIG. 6, but has two separate bottom electrodes 148 and 150. During operation, a relatively high potential may be applied between one of the bottom electrodes, such as electrode 148, to cause an intermediate portion of the first and second electrode portions 152a and 152b to snap down, and in some embodiments, to actually engage the bottom electrode 148. With the first and second electrode portions 152a and 152b in the snapped down position, the support member 154 may be in an upper most position.

Then, smaller potential may be applied between the first and second electrode portions 152a and 152b and the other bottom electrode 150. This potential may cause the first and second electrode portions 152a and 152b to begin to roll down toward the bottom electrode 150, which like above, may cause the supporting leg 154 and support member 156 to move to a lower position. As noted above, this rolling action may provide greater control over the movement of the top support member 156 relative to the bottom plate.

Figure 8:
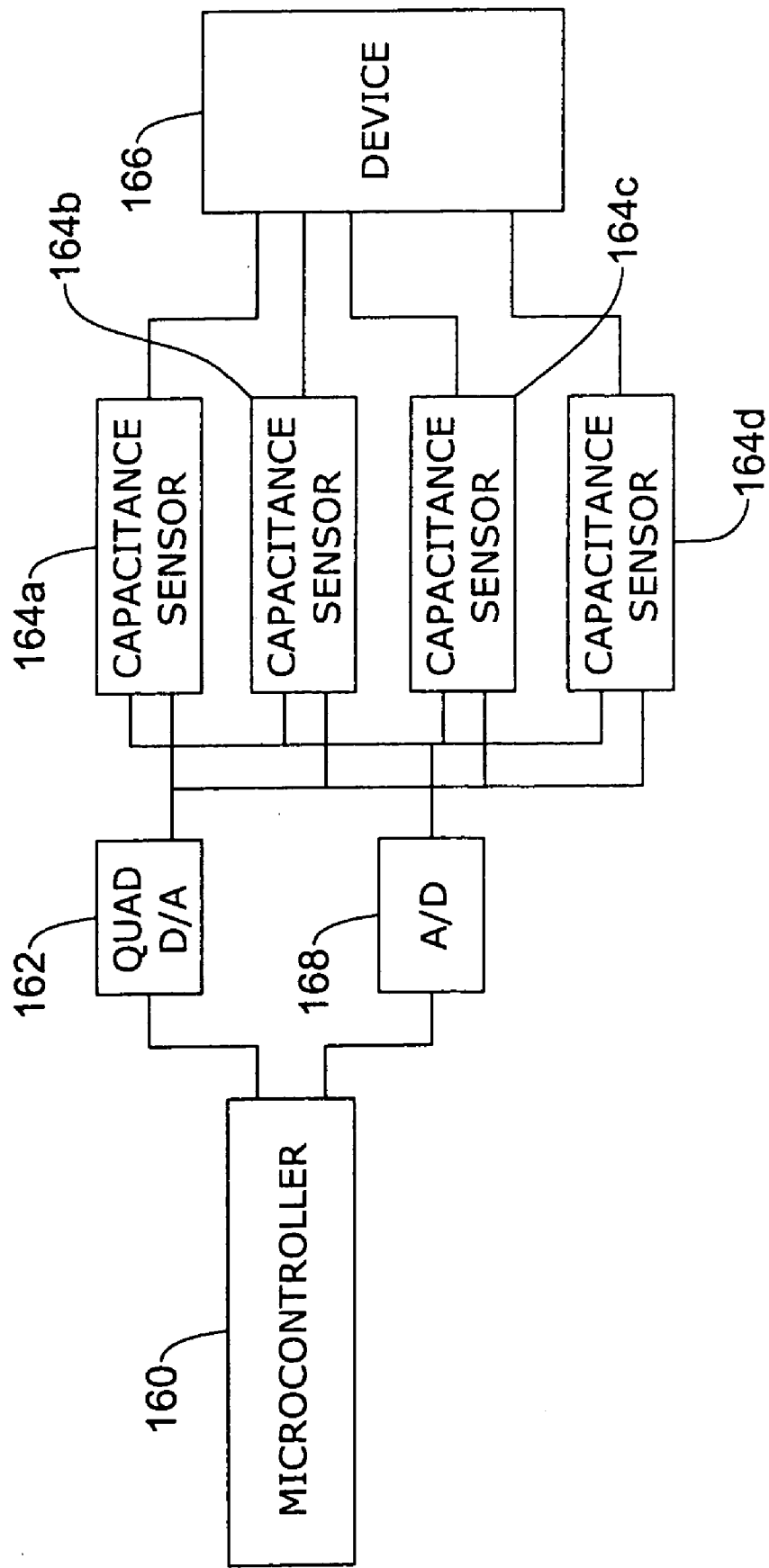
FIG. 8 is a schematic diagraph showing an illustrative control circuit for controlling a bandpass filter.

FIG. 8 is a schematic diagraph showing an illustrative control circuit for controlling the bandpass filter of FIG. 4.

A microcontroller 160 may provide four control words to a quad digital-to-analog (D/A) converter 162. The quad D/A converter 162 may provide individual analog signals to each of the capacitance sensors 164a–164d. In one embodiment, the four capacitance sensors 164a–164b may correspond to the four pairs of top and bottom electrodes of FIG. 4. Alternatively, separate capacitance sensors may be provided. The individual analog signals may provide the necessary electric potential to pull the top plate toward the bottom plate by a desired amount to change the separation gap of the Fabry-Perot cavity. One advantage of providing individual signals to each of the electrode pairs may be to help control the tilt of the top plate. If tilt is not a concern, a single analog signal may be used to commonly drive all four electrode pairs of FIG. 4.

Feedback signals may be provided from each of the capacitance sensors 164a–164b back to the microcontroller 160 through an Analog-to-Digital (A/D) converter 168. The feedback signals may be used to provide a measure of the capacitance between each electrode pair of FIG. 4. The measure of capacitance may be proportional to the separation gap between each electrode pair. When so provided, the microcontroller 160 may adjust each of the four control words provided to the quad D/A converter 162 so that the capacitance between each electrode pair is substantially equal. This may help reduce and/or control the tilt in the top plate relative to the bottom plate.

Figure 9:
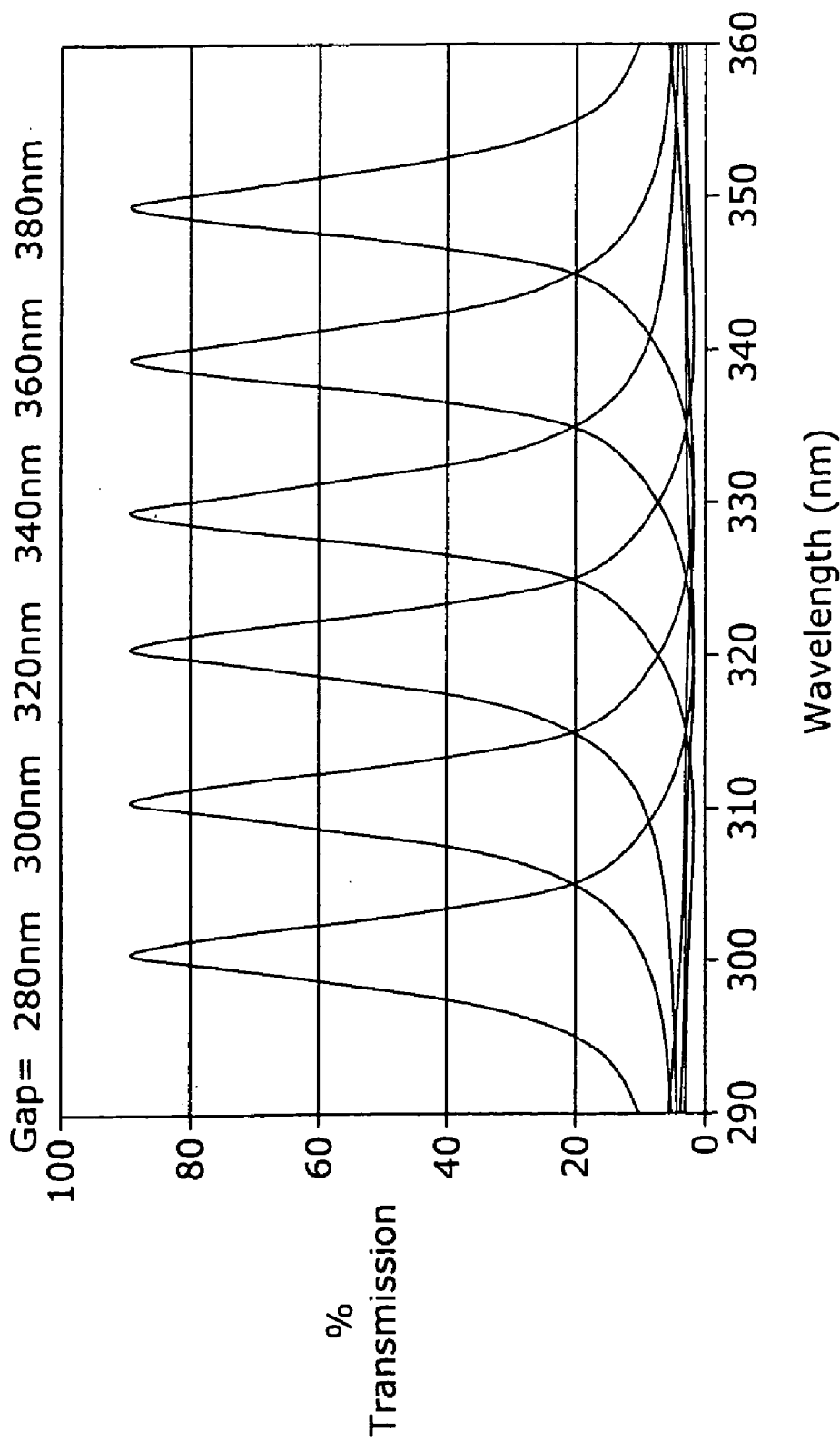
FIG. 9 is a graph showing the calculated percent transmission of the tunable filter of FIG. 3 versus wavelength and gap.

FIG. 9 is a graph showing the calculated percent transmission of the tunable filter of FIG. 3 alone versus incoming wavelength and separation gap. The separation gap between the top plate and the bottom plate is shown across the top of the graph. The wavelength of the incoming light beam is shown across the bottom of the graph. The percentage of the incoming light that is transmitted through the bandpass filter is shown along the "y" axis. As can be seen, as the separation gap increases, the peak wavelength that is transmitted through the bandpass filter may also increase. Thus, the bandpass frequency of the filter may be controlled by simply changing the separation gap between the top and bottom plates. It is recognized that other separations of a similar fractional wavelength can produce similar effects.

Figure 10:
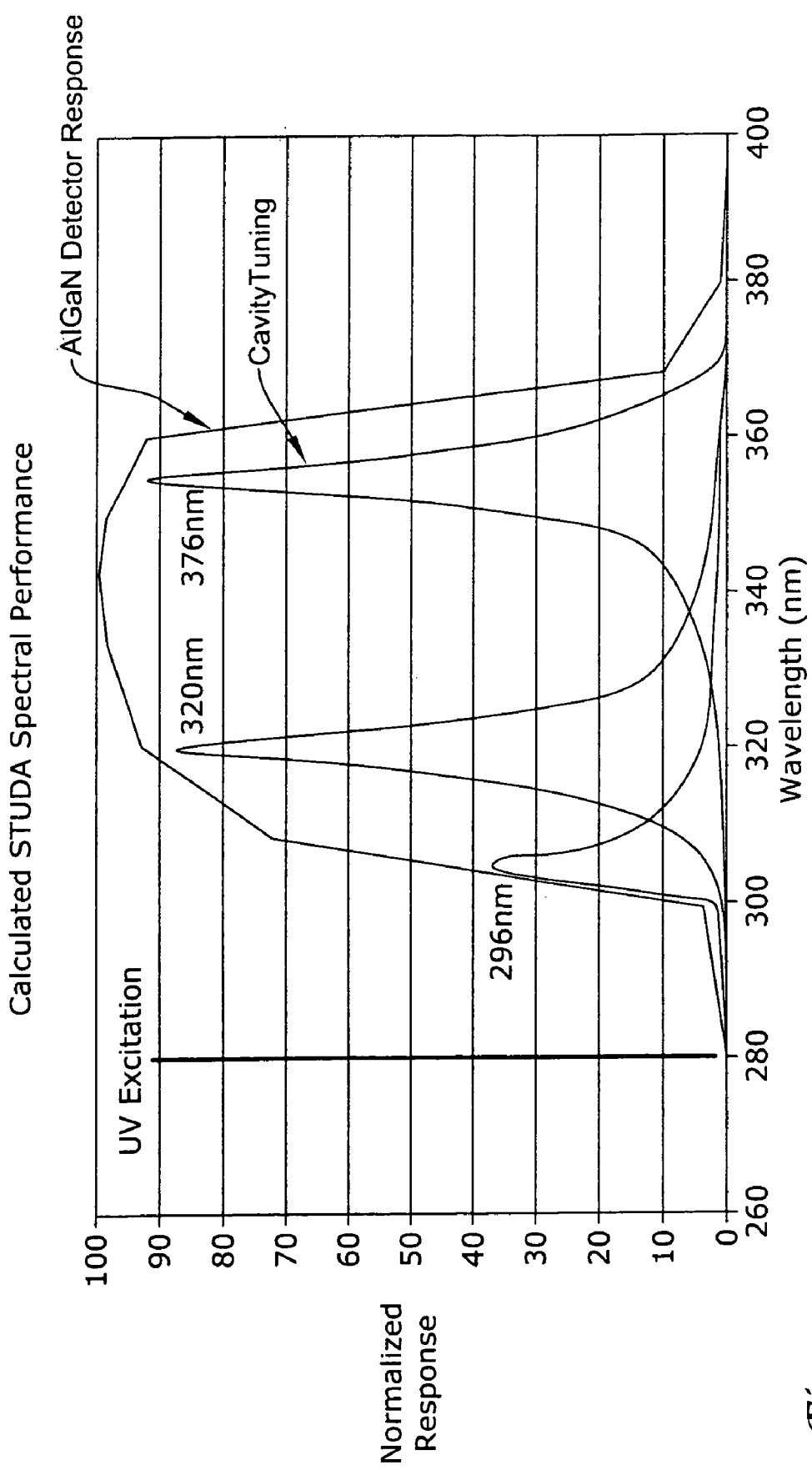
FIG. 10 is a graph showing the calculated normalized response of the tunable bandpass detector of FIG. 3 versus wavelength.

FIG. 10 is a graph showing the calculated normalized response of the tunable bandpass detector of FIG. 3 versus wavelength. The wavelength of the incoming light is shown along the "X" axis, and the normalized response is along the "Y" axis. A first curve 200 shows the normalized response versus wavelength for a separation gap of 320 nm. Likewise, a second curve 202 shows the normalized response versus wavelength for a separation gap of 376 nm. The range of movement of the top and/or bottom plate may determine the spectral range of the wavelengths of interest. In the example shown, the top and/or bottom plate may be moved between a separation gap of 320 nm to 376 nm. This may produce a spectral range of the bandpass filter from about 320 nm to about 355 nm.

The response of the detector and transmission of the substrate may be set to encompass the entire expected spectral range of bandpass filter. Curve 204 shows such a spectral range. Curve 204 encompasses the entire spectral range from about 320 nm to about 355 nm of the bandpass filter.

Figure 11A:
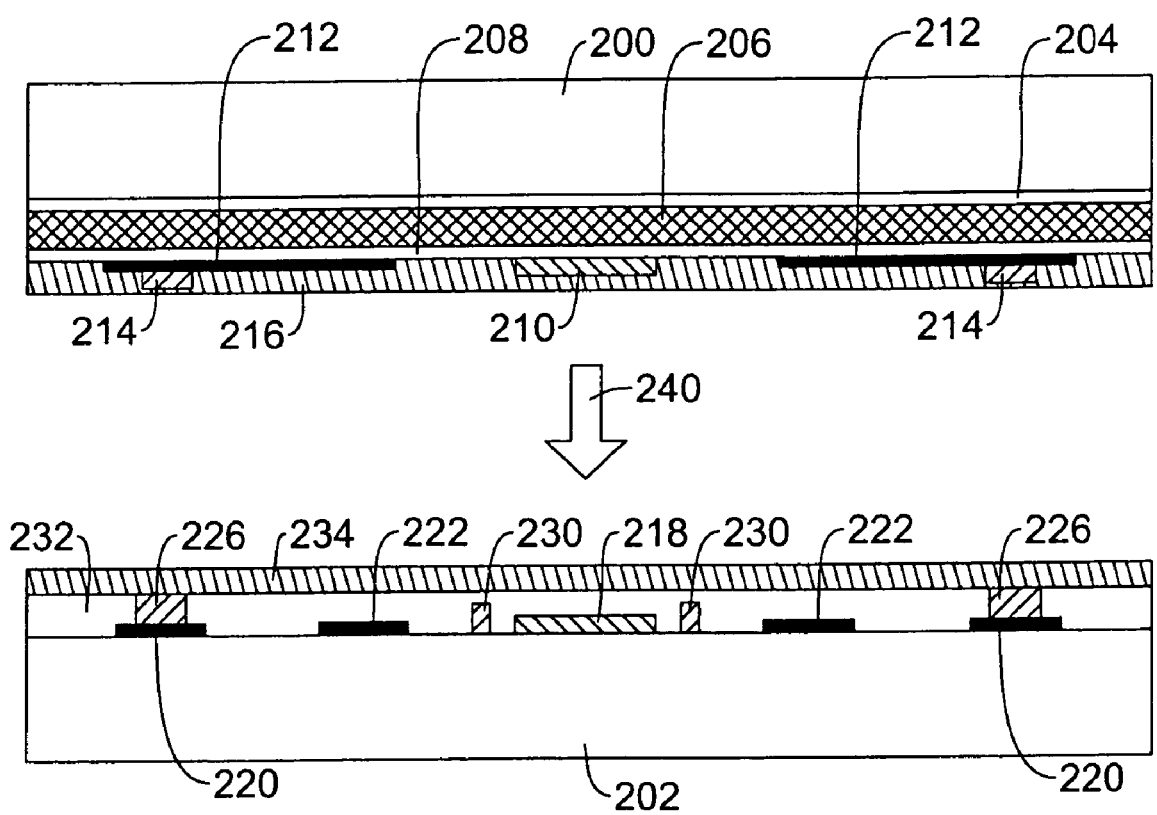
FIGS. 11A–11F are schematic cross-sectional side views showing an illustrative method for making a tunable bandpass filter.

A number of illustrative methods are contemplated for forming a tunable bandpass filter. FIGS. 11A–11F are schematic cross-sectional side views showing one such illustrative method. Turning to FIG. 11A, a first substrate 200 and a second substrate 202 may be provided. The first substrate 200 may be a silicon wafer or some other suitable material. The second substrate 202 may be a silica substrate, glass, Pyrex, sapphire or some other suitable material. The second substrate 202 may be relatively optically transparent to the desired wavelength of interest (such as UV).

Turning again to FIG. 11A, an etch stop layer 204 may be provided on the first substrate 200. The etch stop layer may be any type of etch stop layer, but in the illustrative embodiment, may be molybdenum. Molybdenum may be easily removed, such as with hydrogen peroxide, to separate the first substrate from the remaining structure, as further described below. Next a support layer 206 may be provided. The support layer may be polysilicon, but any suitable material will do. A buffer layer 208 may be provided if desire to help bond the mirror region to the polysilicon support layer 206, as further discussed below.

Next, a top mirror 210 may be provided and patterned. The top mirror may be a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, and so forth. Alternatively, the top mirror may simply include one or more metal layers, such as an aluminum layer. It should be recognized that these are only illustrative, and that the top mirror may be made from any suitable material or material system that provides the desired reflectivity.

Once patterned as shown, upper electrodes 212 may be provided and patterned. The upper electrodes 212 may be metal, such as aluminum, copper or some other suitable conductor. Conductive pads 214 are then provided, as shown. Finally, a layer of polyimide 216 may be provided over the top mirror 210, upper electrodes 212 and conductive pads 214, as shown.

A bottom mirror 218 may be provided and patterned on the second substrate 202, as shown. The bottom mirror may be a Distributed Bragg reflector that includes a semiconductor and/or dielectric mirror stack. Alternatively, the bottom mirror might not be patterned. Like the top mirror 210, the Distributed Bragg reflector may include, for example, a number of alternating layers of $ZrO_2/SiO_2$, $HfO_2/SiO_2$, and so on: Alternatively, the top mirror may simply include one or more metal layers, such as one or more aluminum layers. It should be recognized that these are only illustrative, and that the top mirror may be made from any suitable material or material system that provides the desired reflectivity. In some embodiments, the bottom mirror 218 might not be patterned, and may be left to cover the entire surface of the second substrate 202.

Bottom electrodes 222 and bottom pads 220 are then provided and patterned. Bottom electrodes 222 may be arranged to be in registration with the upper electrodes 212. Likewise, bottom pads 220 may be arranged to be in registration with the upper conductive pads 214. Bottom conductive pads 226 may be provided on top of bottom pads 220, as shown. Bottom conductive pads 226 and top conductive pads 214 may be sized to provide the desired separation between the top mirror 210 and the bottom mirror 218.

The bottom conductive pads 226 and top conductive pads 214 may be formed using conventional metal film processing techniques. Since metal film processing techniques are typically accurate to Angstrom like thickness over short distances, the desired separation gap may be achieved across the structure. Standoffs 230 may be provided to help prevent the top mirror 210 from engaging the bottom mirror 218 during actuation of the bandpass filter, as further described below.

A first layer 232 of polyimide may be then provided. The first layer 232 of polyimide may be heated and hard cured. A second layer of polyimide 234 may be also provided. Like the layer of polyimide 216 discussed above, the second layer of polyimide 234 may be only soft cured.

Figure 11B:
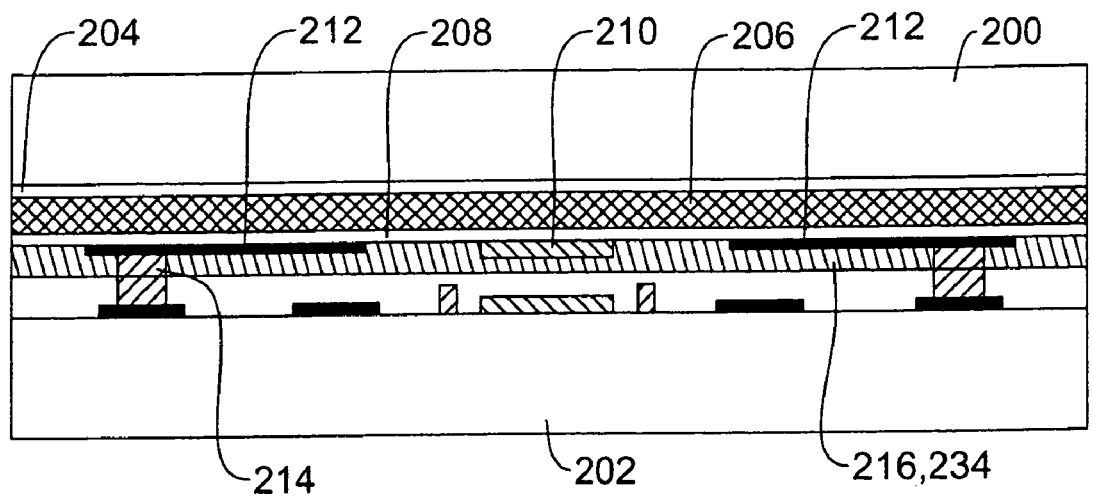

Next, the first substrate 200 may be brought into engagement with the second substrate 202, as indicated by arrow 240. The result is shown in FIG. 11B. This step may use polyimide adhesion. Because the polyimide layers 216 and 234 are only soft cured, they may remain deformable. The two substrates may be assembled in a wafer bonding process where heat, pressure and vacuum are applied. The vacuum may help remove trapped constituents. The pressure may be used to force the two substrates together. The heat (e.g., to 400 degrees C.) may hard cure the polyimide to form a fused substrate sandwich.

Figure 11C:
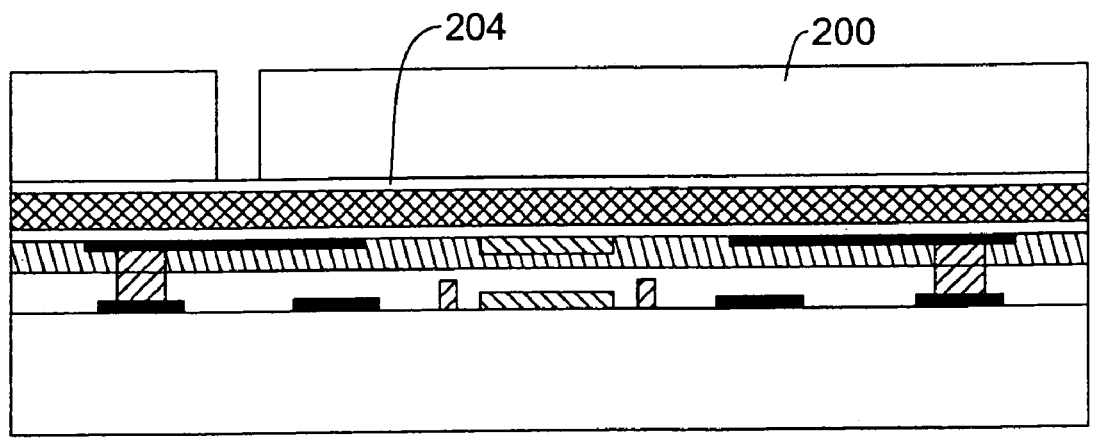

Next, and as shown in FIG. 11C, holes may be etched through the first substrate 200, down to the etch stop layer 204. Next, the etch stop layer 204 may be removed to release the first substrate 200 from the structure. When the etch stop layer 204 is molybdenum, a hydrogen peroxide solution may be used to remove the etch stop layer and release the first substrate.

Figure 11D:
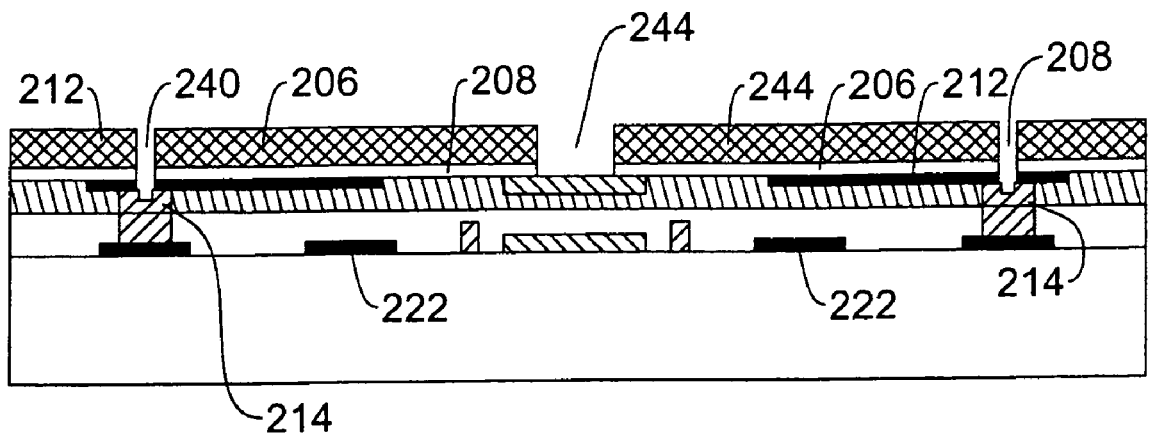
Figure 11E:
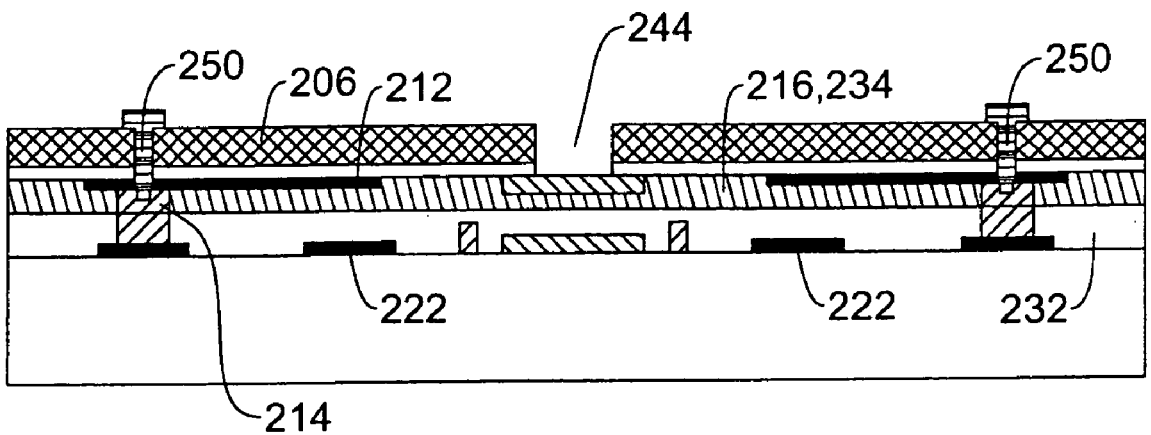

Next, and as shown in FIG. 11D, holes 240 may be etched through the polysilicon layer, the buffer layer 208, the upper electrodes 212, and into the upper conductive pads 214. Also, a window 244 may be etched through the polysilicon layer and the buffer layer 208 to expose the top mirror 210.

Figure 11F:
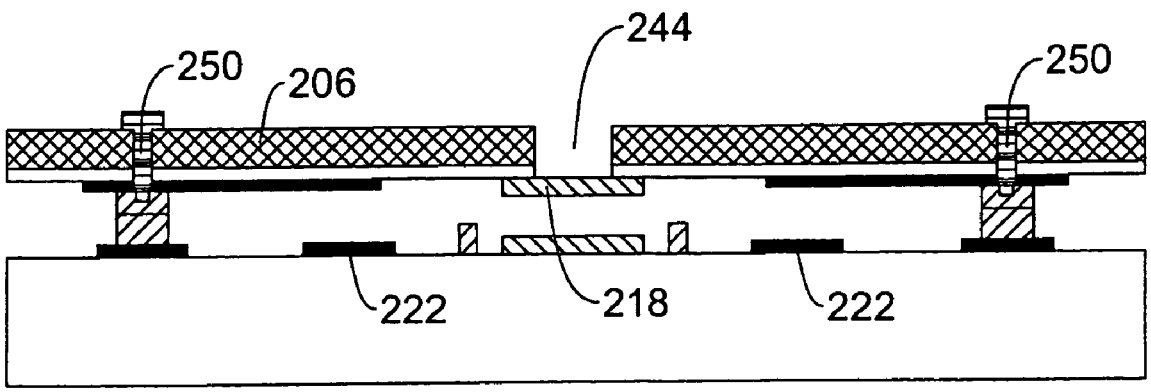

Next, and as shown in FIG. 1E, metal may be deposited into the etched holes 240 to provide plugs 250 that make electrical contact to both the upper electrodes 212 and the conductive pads 214. Besides providing an electrical connection, the plugs 250 may also help pin the polysilicon support layer 206 to the conductive pads 214. A final dry etch (e.g., an oxygen plasma etch) may be used to remove the polyimide sacrificial layers 216, 234 and 232 to release the top structure from the bottom structure, as shown in FIG. 11F.

Figure 12D:
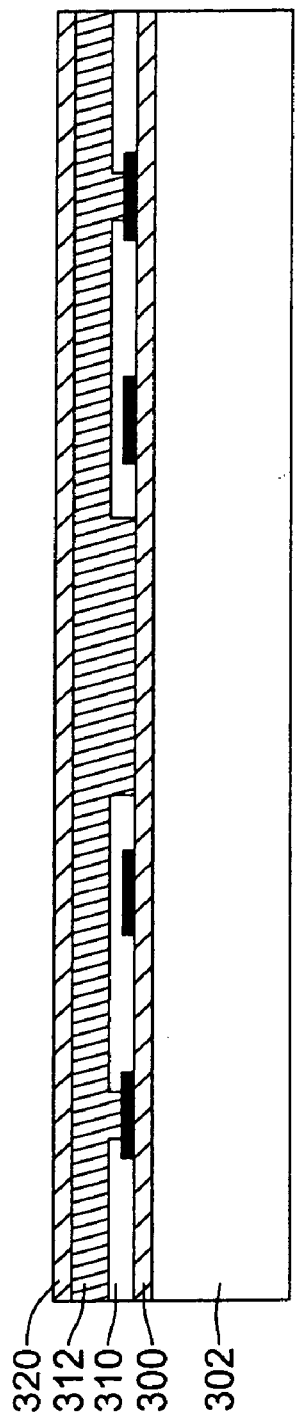

FIGS. 12A–12I are schematic cross-sectional side views showing yet another illustrative method for making a tunable bandpass filter. Turning first to FIG. 12A, a bottom mirror 300 may be grown on a substrate 302. The bottom mirror 300 may be a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, and so on. Alternatively, the bottom mirror may simply include one or more metal layers, such as one or more aluminum layers. It should be recognized that these are only illustrative, and that the bottom mirror 300 may be made from any suitable material or material system that provides the desired reflectivity.

Next, and as shown in FIG. 12B, bottom electrodes 304 and bottom conducting pads 306 may be provided. A dielectric or other protecting layer 310 may be then provided over the bottom electrodes 304 and bottom conducting pads 306. The dielectric or other protecting layer 310 may be then patterned to expose the bottom conducting pads 306, as shown.

Figure 12E:
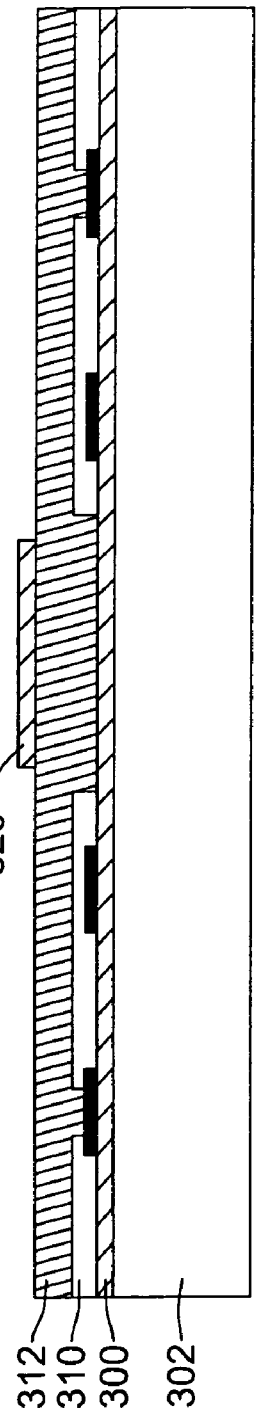

Next, and as shown in FIG. 12C, a sacrificial layer 312 may be provided. The sacrificial layer 312 may be polyimide, but may be any suitable material. Next, and as shown in FIG. 12D, a top mirror 320 may be provided. The top mirror 320 may be a Distributed Bragg reflector that includes a semiconductor and/or dielectric mirror stack. Like the bottom mirror 300, the Distributed Bragg reflector may include, for example, a number of alternating layers of $ZrO_2/SiO_2$, $HfO_2/SiO_2$, and so on. Alternatively, the top mirror may simply include one or more metal layers, such as one or more aluminum layers. It should be recognized that these are only illustrative, and that the top mirror may be made from any suitable material or material system that provides the desired reflectivity. The top mirror 320 may be then patterned, as shown in FIG. 12E.

Figure 12F:
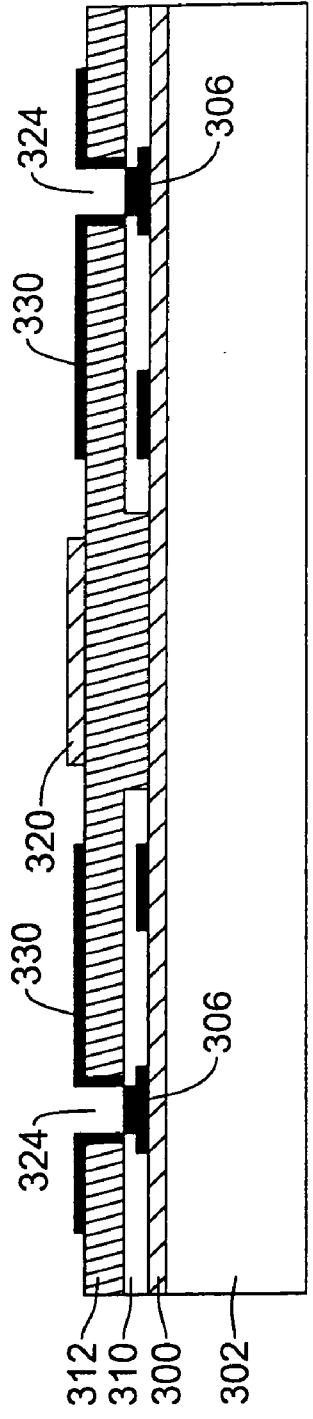

Next, and as shown in FIG. 12F, holes 324 may be etched through the polyimide layer 312 down to the conductive pads 306. Next, a metal layer may be deposited and patterned to form top electrode regions 330. The metal may extend into holes 324 to form an electrical connection with bottom conducting pads 306, as shown.

Next, and as shown in FIG. 12G, a support layer 340 may be provided over the top surface of the structure. The support layer may bond to the top mirror 320, and fill the holes 324. A buffer layer may be provided first to help bond the layers, if desired. The support layer 340 may be $SiO_2$.

Figure 12I:
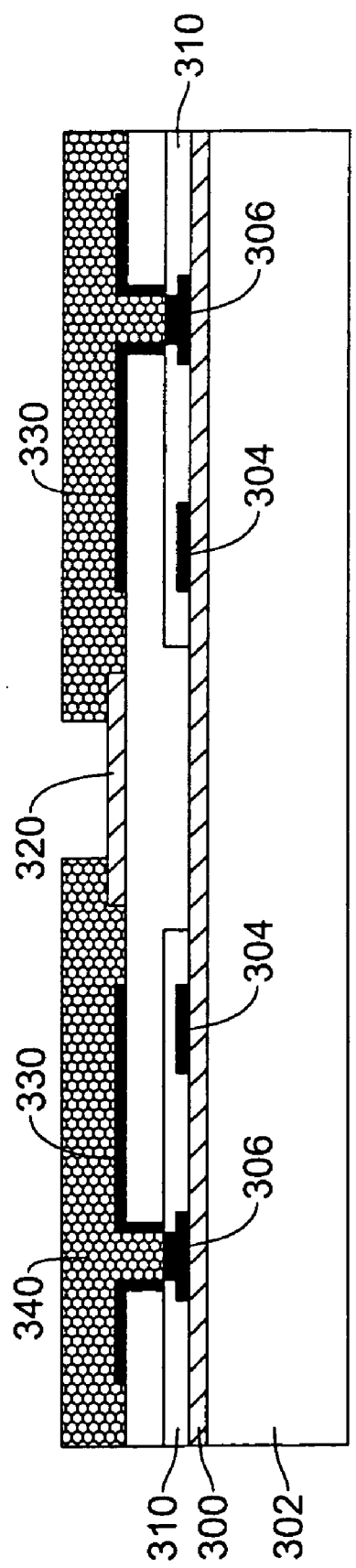

Next, the support layer 340 may be patterned to expose the top mirror 320. The support layer 340 may overlap the outer perimeter of the top mirror 320, as shown. This overlap may help form a bond between the support layer 340 and the top mirror 320. Finally, and as shown in FIG. 12I, a dry etch may be used to remove the polyimide sacrificial layer 312 to release the top structure from the bottom structure, as shown. The dry etch may be an oxygen plasma etch. Note, the dielectric or protective layer 310 may help prevent an electrical short between the top electrodes 330 and the bottom electrodes 304 if they are drawn together under electrostatic actuation. An anneal may be performed to help reduce the stress in the structure, including the $SiO_2$ support layer 340. The anneal may be performed before or after the polyimide sacrificial layer 312 may be removed, as desired.

Figure 13A:
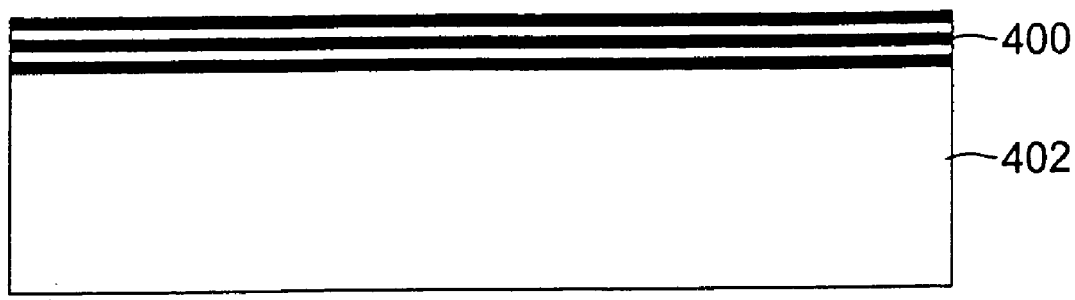
FIGS. 13A–13H are schematic cross-sectional side views showing another illustrative method for making a tunable bandpass filter.

FIGS. 13A–13H are schematic cross-sectional side views showing another illustrative method for making a tunable bandpass filter. Turning first to FIG. 13A, a bottom mirror 400 may be grown on a substrate 402. The bottom mirror 400 may be a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, and so on. Alternatively, the bottom mirror 400 may simply include one or more metal layers, such as an aluminum layer. It should be recognized that these are only illustrative, and that the bottom mirror 400 may be made from any suitable material or material system that provides the desired reflectivity.

Figure 13B:
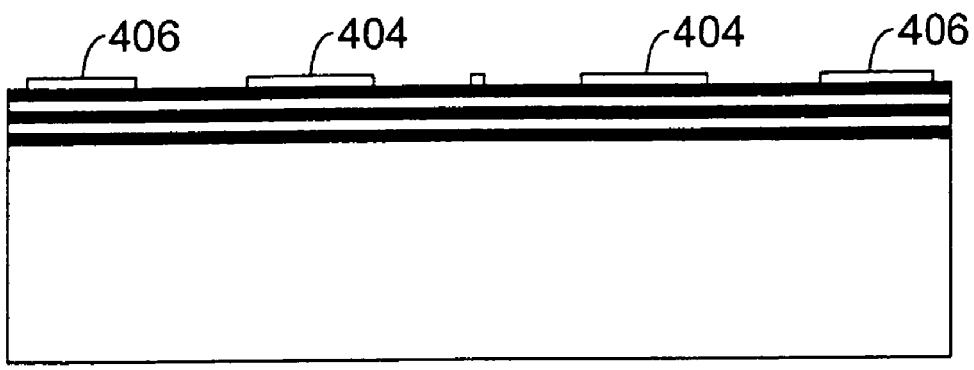

Next, and as shown in FIG. 13B, bottom electrodes 404 and bottom conducting pads 406 may be provided. A dielectric or other protecting layer 410 may be provided over the bottom electrodes 404 and bottom conducting pads 406 (see FIG. 13C). The dielectric or other protecting layer 410 may then be patterned to expose the bottom conducting pads 406, as shown in FIG. 13C.

Figure 13C:
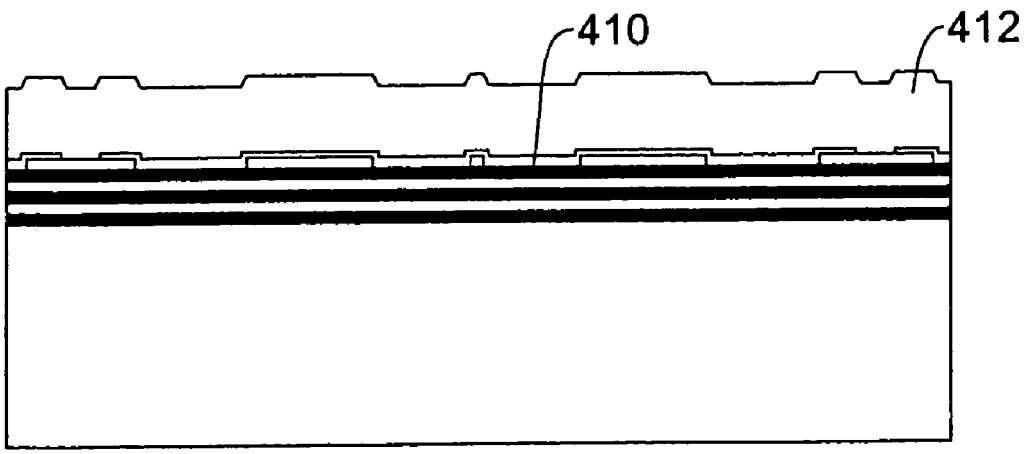
Figure 13D:
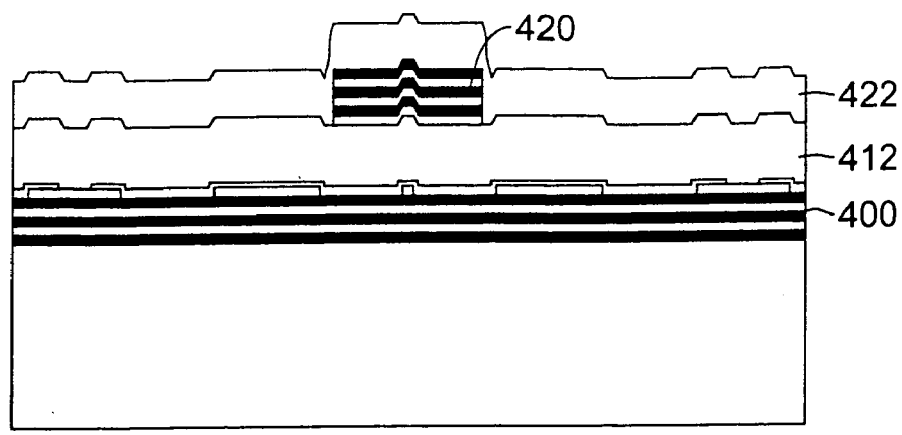

Next, and as shown in FIG. 13C, a first sacrificial layer 412 may be provided. The first sacrificial layer 412 may be polyimide, but might be any suitable material. Next, and as shown in FIG. 13D, a top mirror 420 may be provided. The top mirror 420 may be a Distributed Bragg reflector that includes a semiconductor and/or dielectric mirror stack. Like the bottom mirror 400, the Distributed Bragg reflector may include, for example, a number of alternating layers of $ZrO_2/SiO_2$, $HfO_2/SiO_2$, and so forth. Alternatively, the top mirror 420 may simply include one or more metal layers, such as one or more aluminum layers. It should be recognized that these are only illustrative, and that the top mirror may be made from any suitable material or material system that provides the desired reflectivity. The top mirror 420 may be then patterned, as shown in FIG. 13D. Then, a second sacrificial layer 422 may be provided over the first sacrificial layer 412 and the patterned top mirror 420.

Figure 13E:
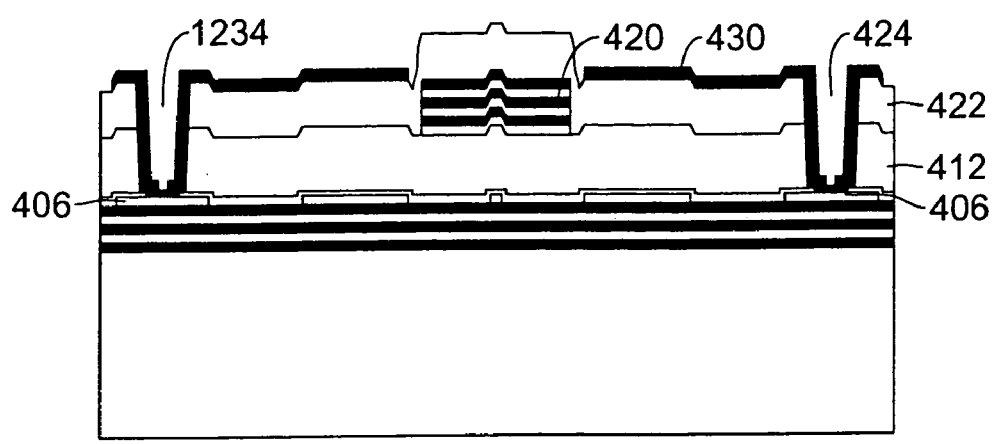

Next, and as shown in FIG. 13E, holes 424 may be etched through the first sacrificial layer 412 and the second sacrificial layer 422 down to the conductive pads 406. Next, a metal layer may be deposited and patterned to form top electrode regions 430. The metal layer may extend into holes 424 to form an electrical connection with bottom conducting pads 406, as shown.

Figure 13F:
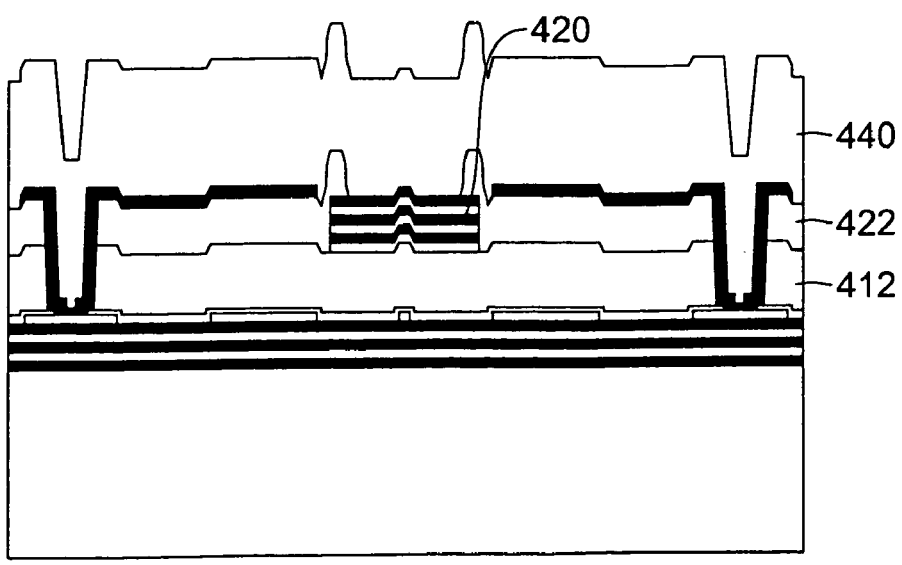

Next, and as shown in FIG. 13F, the portion of the second sacrificial layer 422 above the top mirror 420 may be removed. A support layer 440 may be then provided over the top surface of the resulting structure. The support layer 440 may bond to the top mirror 420, and fill the holes 424. A buffer layer may be provided first to help bond the layers, if desired. The support layer 440 may be $SiO_2$, but this is not required.

Figure 13G:
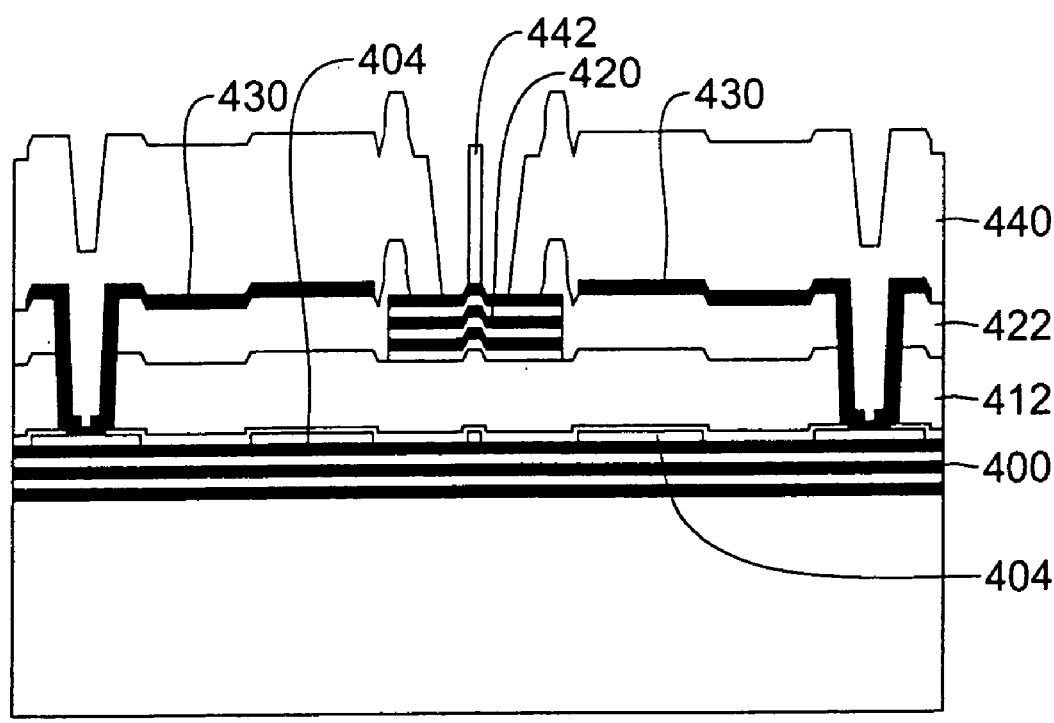

Next, and as shown in FIG. 13G, the support layer 340 may be patterned to expose the top mirror 420. While a thin column member 442 remains in FIG. 13G, this is not required. In addition, the top mirror 420 is shown having a ridge in the central portion thereof. In some embodiments, this ridge may be eliminated, and the top mirror 420 may be substantially planar. Also, the support layer 340 may be patterned to define one or more elongated supporting legs, such as those shown and described with respect to FIGS. 4–7 above.

Figure 13H:
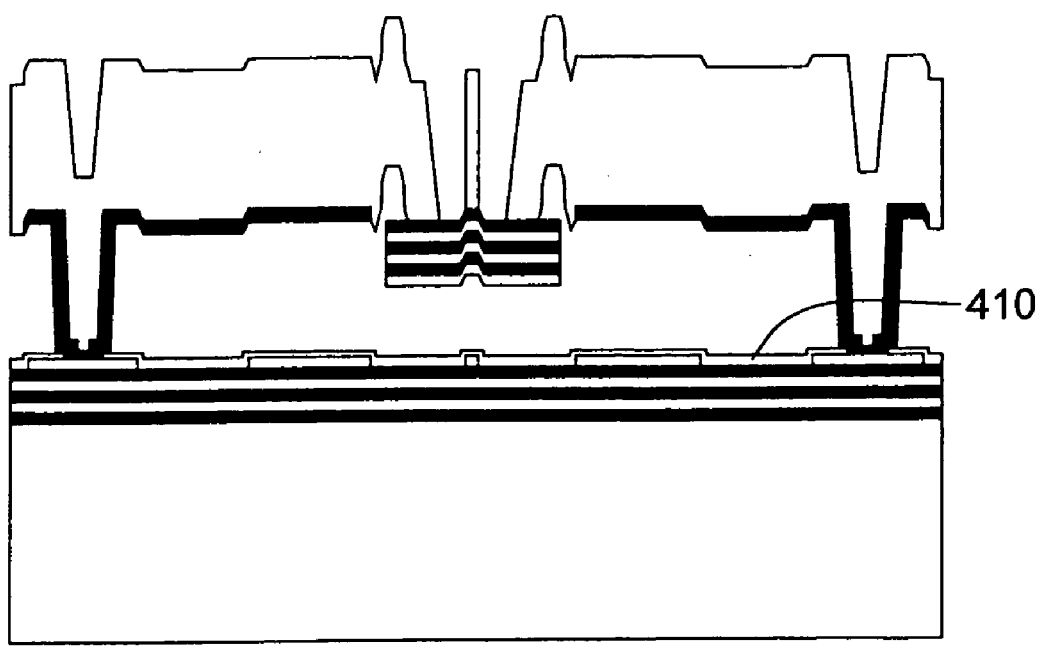

The support layer 440 may overlap the outer perimeter of the top mirror 420, as shown. This overlap may help form a bond between the support layer 440 and the top mirror 420. Finally, and as shown in FIG. 13H, a dry etch may be used to remove the first and second sacrificial layers 412 and 422 to release the top structure from the bottom structure, as shown. The dry etch may be, for example, an oxygen plasma etch. An anneal may be performed to help reduce the stress in the structure, including in the $SiO_2$ support layer 440. The anneal may be performed before or after the first and second sacrificial layers 412 and 422 are removed, as desired.

The illustrative structure shown in FIGS. 13A–13H positions the top electrodes 430 further from the bottom electrodes 404 than the embodiment shown in FIGS. 12A–12I. It has been found that under some circumstances, the top electrodes 430 may tend to snap down toward the bottom electrodes 404 when the distance between the top electrodes 430 and the bottom electrodes 404 is reduced through electrostatic actuation (e.g., when the distance is reduced by about one-third). Therefore, to increase the distance that the top mirror 420 can travel relative to the bottom mirror 400 without experiencing the snapping action, the top electrode 430 may be purposefully moved further from the bottom electrode 404. In addition, the top mirror 420 may be positioned below the top electrode 430, as shown.

Figure 14A:
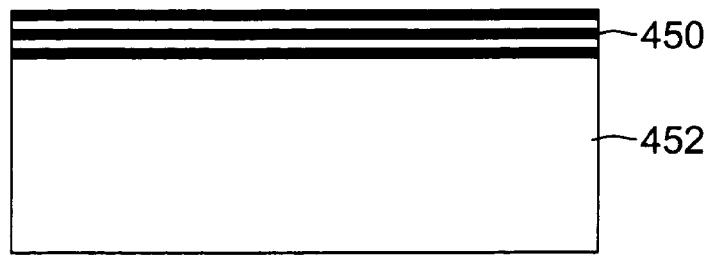
FIGS. 14A–14K are schematic cross-sectional side views showing yet another illustrative method for making a tunable bandpass filter.

FIGS. 14A–14K are schematic cross-sectional side views showing yet another illustrative method for making a tunable bandpass filter. Turning first to FIG. 14A, a bottom mirror 450 may be grown on a substrate 452. The substrate 452 may be, for example, Pyrex, sapphire or any other suitable material. The bottom mirror 450 may be a Distributed Bragg reflector that includes a semiconductor and/or dielectric mirror stack. The Distributed Bragg reflector may include, for example, a number of alternating layers of $ZrO_2/SiO_2$, $HfO_2/SiO_2$, etc. Alternatively, the bottom mirror 450 may simply include one or more metal layers, such as an aluminum layer. It should be recognized that these are only illustrative, and that the bottom mirror 450 may be made from any suitable material or material system that provides the desired reflectivity.

Figure 14B:
Figure 14C:
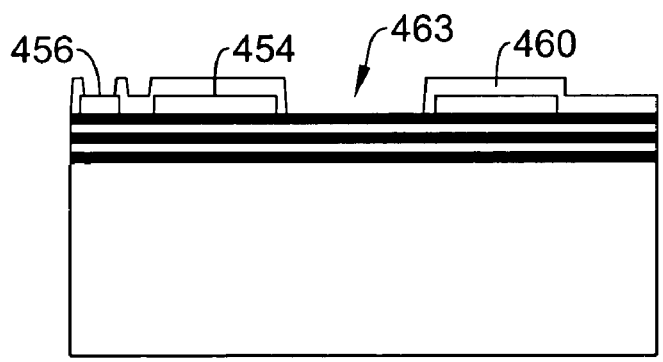

Next, and as shown in FIG. 14B, bottom electrodes 454 and bottom conducting pads 456 may be provided. The bottom electrodes 454 and conducting pads 456 may be deposited by lift-off, but any suitable process may be used. Next, and as shown in FIG. 14C, a dielectric or other protecting layer 460 may be provided over the bottom electrodes 454 and bottom conducting pads 456. The dielectric or other protecting layer 460 may then be patterned to expose the bottom conducting pads 456 and the optical window area 463, as shown in FIG. 14C. Layer 460 may be any type of dielectric or other protecting layer including, for example, alumina passivation.

Figure 14D:
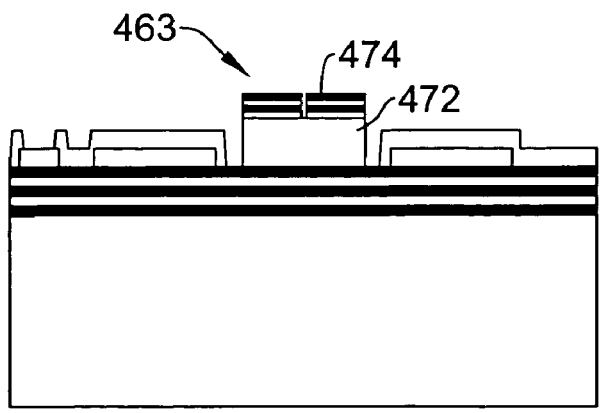

Next, and as shown in FIG. 14D, a first sacrificial layer 472 may be provided and patterned in the optical window area 463. The first sacrificial layer 472 may be about 4000 A of metal, but may be any suitable material. Next, and as further shown in FIG. 14D, a top mirror 474 may be provided. The top mirror 474 may be a Distributed Bragg reflector that includes a semiconductor and/or dielectric mirror stack. Like the bottom mirror 450, the Distributed Bragg reflector may include, for example, a number of alternating layers of $ZrO_2/SiO_2$, $HfO_2/SiO_2$, and so forth. Alternatively, the top mirror 474 may simply include one or more metal layers, such as one or more aluminum layers. It should be recognized that these are only illustrative, and that the top mirror 474 may be made from any suitable material or material system that provides the desired reflectivity. The top mirror 474 may be then patterned, as shown in FIG. 14D.

Figure 14E:
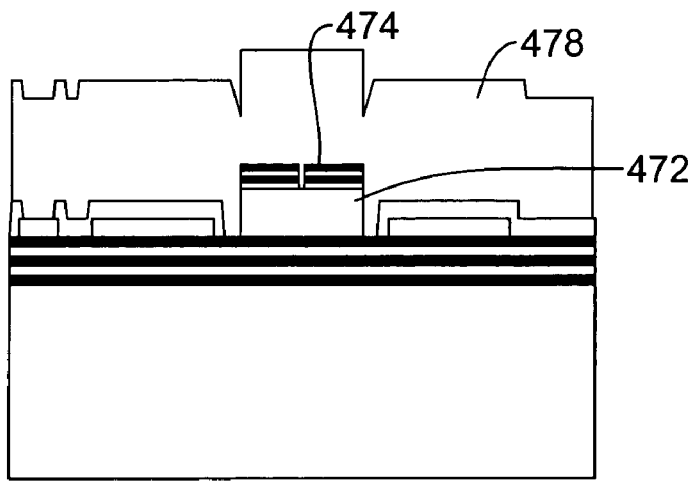
Figure 14F:
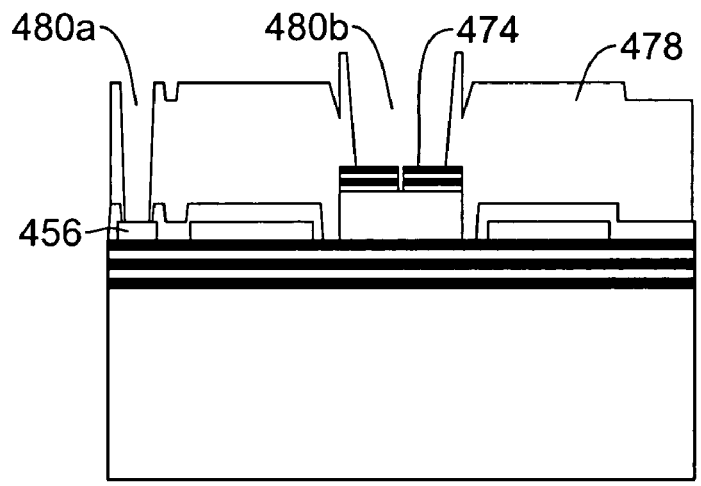

Next, and as shown in FIG. 14E, a second sacrificial layer 478 may be provided over the patterned top mirror 474. The second sacrificial layer 478 may be about 8000 A of polimide, but may be any suitable material. Next, and as shown in FIG. 14F, one or more holes 480a and 480b may be etched through the second sacrificial layer 478 down to the conductive pads 456 and the top mirror 474, respectively. The holes 480a and 480b might not extend all the way to the lateral edges of the conductive pads 456 and the top mirror 474, but this is not required.

Figure 14G:
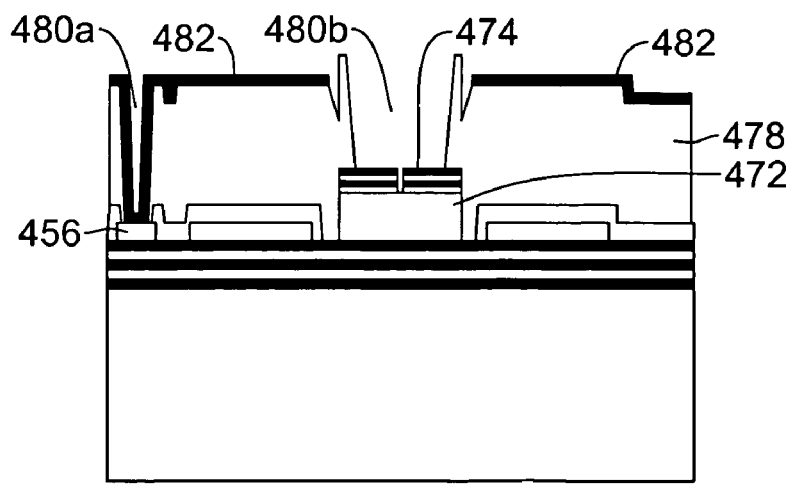

Next, and as shown in FIG. 14G, a metal layer may be deposited and patterned to form top electrode regions 482. The metal layer 482 may extend into hole 480a to form an electrical connection with bottom conducting pads 456, as shown. The metal layer 482 may be removed from above the top mirror 474.

Figure 14H:
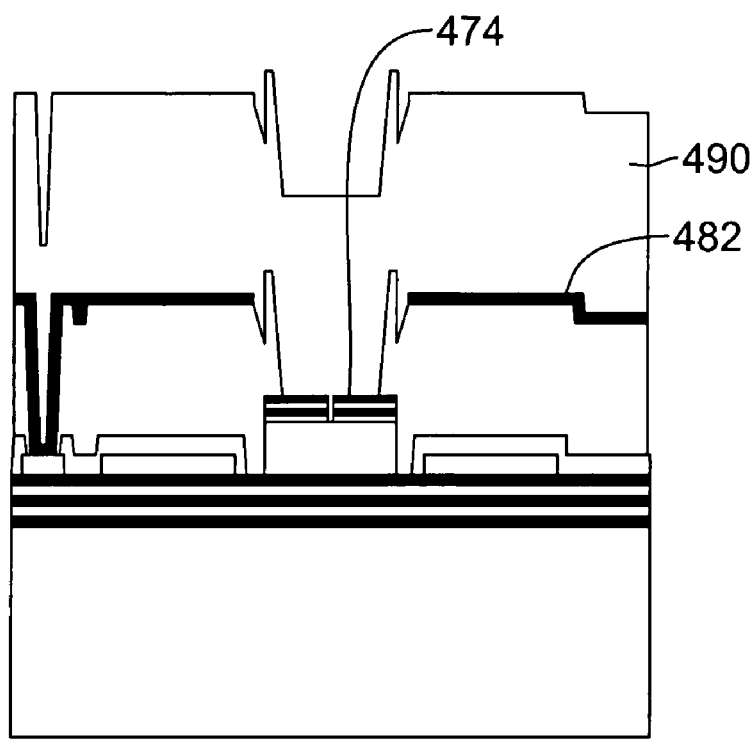

Next, and as shown in FIG. 14H, a support layer 490 may be provided over the top surface of the resulting structure. The support layer 490 may bond to the top mirror 474, and fill the hole 480b. A buffer layer may be provided first to help bond the layers, if desired. The support layer 490 may be nominally about 3 μm of $SiO_2$, but other thicknesses and materials may be used.

Figure 14I:
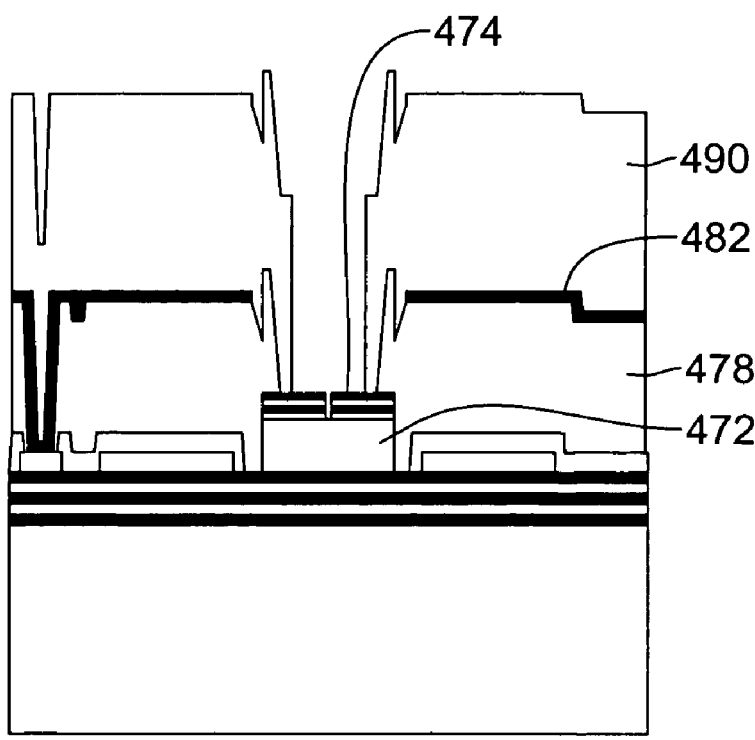

Next, and as shown in FIG. 14I, the support layer 490 may be patterned to expose the top mirror 474. The support layer 490 may overlap the outer perimeter of the top mirror 474, as shown. This overlap may help form a bond between the support layer 490 and the top mirror 474. Also, the support layer 490 may be patterned to define one or more elongated supporting legs, such as those shown and described with respect to FIGS. 4–7 above.

Figure 14J:
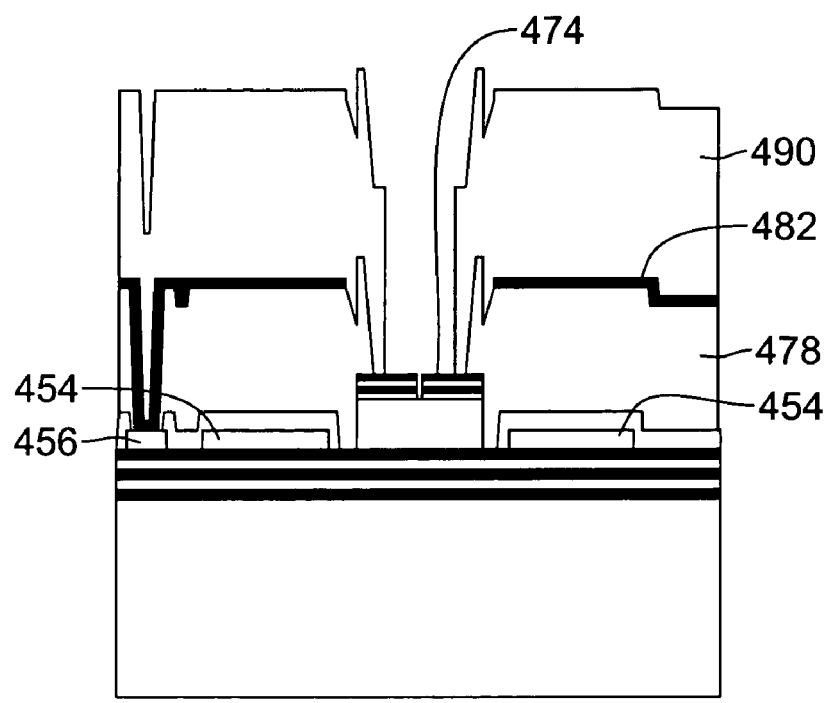

Next, and as shown in FIG. 14J, the first sacrificial layer 472 may be removed. The first sacrificial layer 472 may be removed with a wet etch to release the top mirror 474 from the bottom mirror 450. It is contemplated that the first sacrificial layer 472 may be made from a material that can be selectively etched relative to the remaining structure.

Figure 14K:
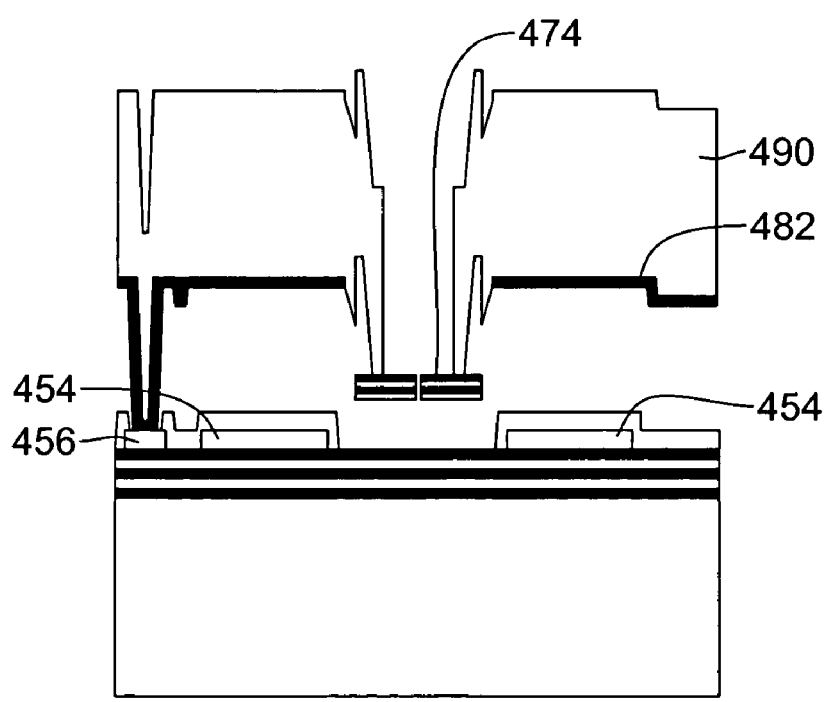

Next, and as shown in FIG. 14K, the second sacrificial layer 478 is removed to release the top structure from the bottom structure, as shown. This may be performed using a dry etch such as an oxygen plasma etch. An anneal may be performed to help reduce the stress in the structure, including in the $SiO_2$ support layer 490. The anneal may be performed before or after the first and second sacrificial layers 472 and 478 are removed, as desired.

The illustrative structure shown in FIGS. 14A–14K positions the top electrodes 482 further from the bottom electrodes 454 than the embodiment shown in FIGS. 12A–12I. It has been found that under some circumstances, the top electrodes 482 may tend to snap down toward the bottom electrodes 454 when the distance between the top electrodes 482 and the bottom electrodes 454 is reduced through electrostatic actuation (e.g., when the distance is reduced by about one-third). Therefore, to increase the distance that the top mirror 474 can travel relative to the bottom mirror 450 without experiencing the snapping action, the top electrodes 482 may be moved further from the bottom electrode 454. In addition, the top mirror 474 has been positioned below the top electrodes 482, as shown.

Figure 15A:
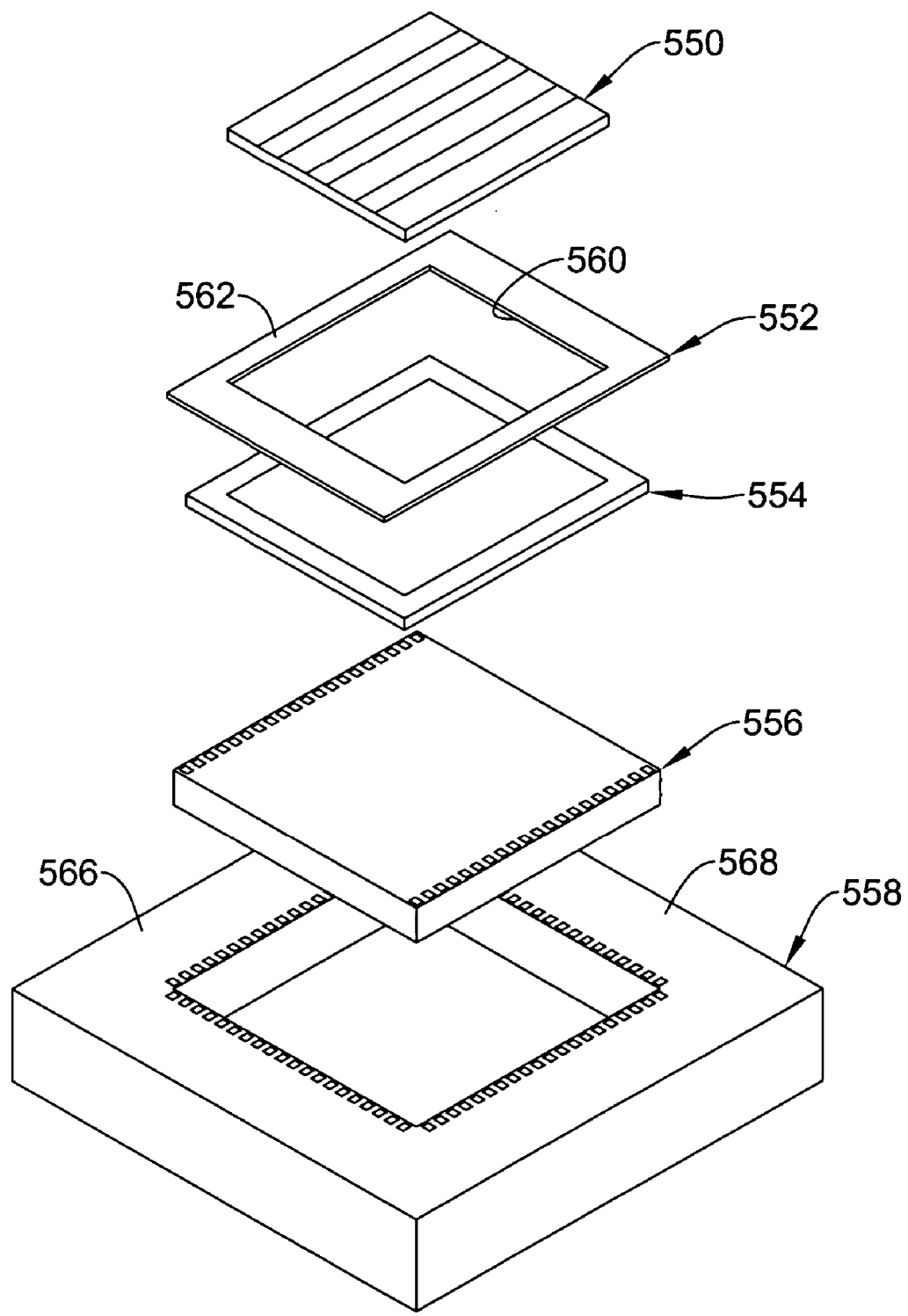
FIGS. 15A–15C are perspective views of an illustrative assembly of a tunable bandpass filter.
Figure 15B:
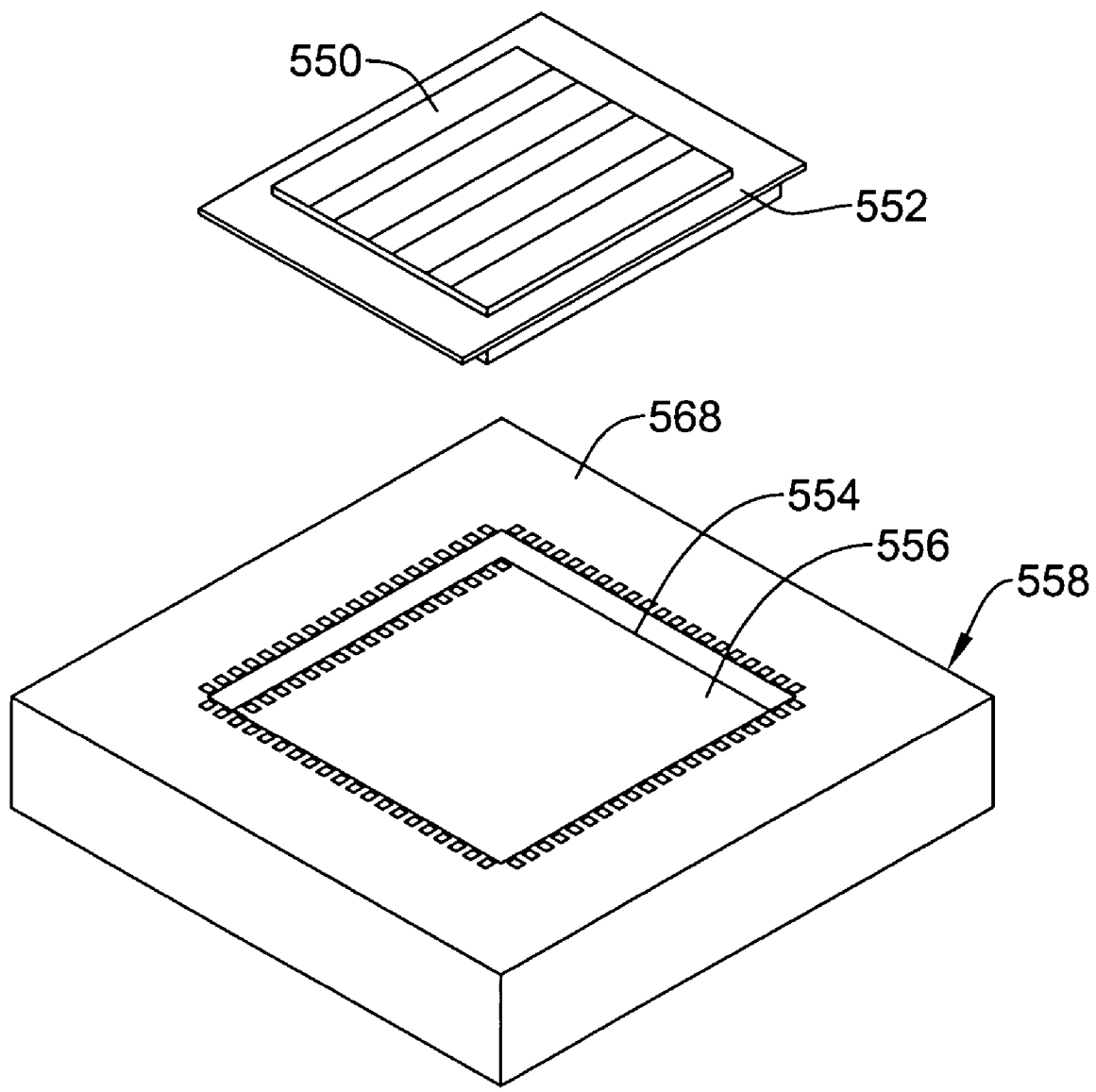
Figure 15C:
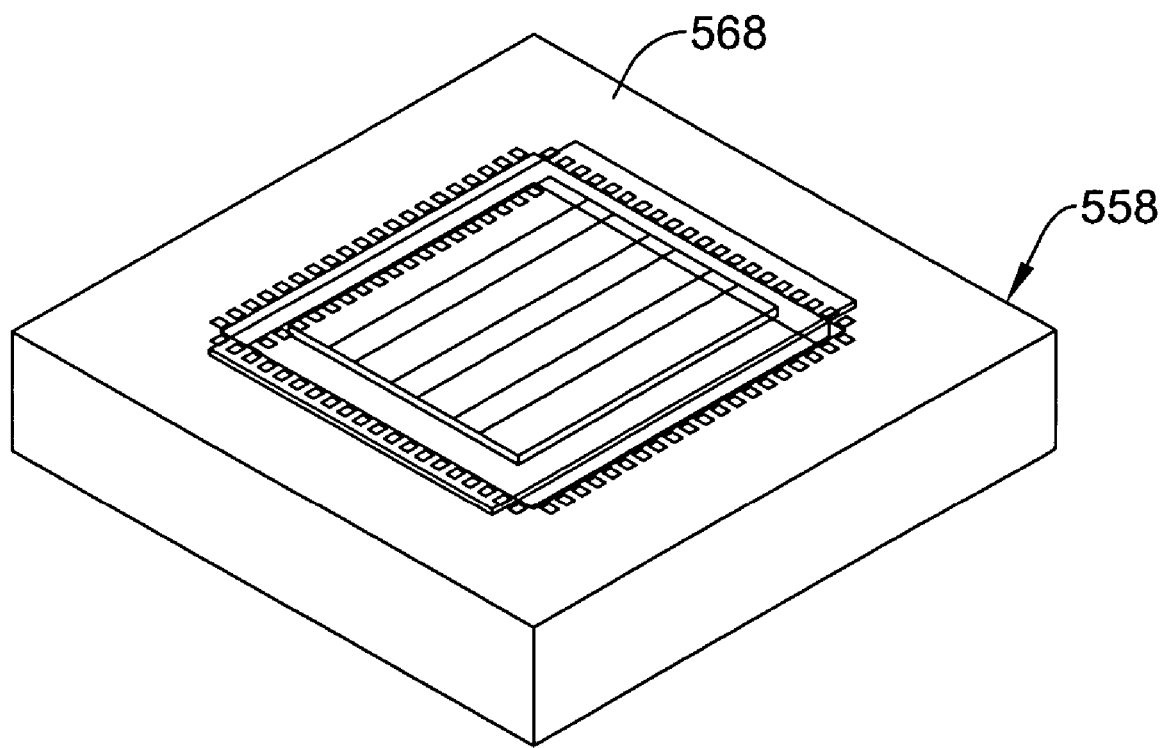

FIGS. 15A–15C are perspective views of an illustrative assembly of a tunable bandpass filter. FIG. 15A shows various components including a tunable bandpass filter 550, a lead frame 552, a detector 554, readout electronics 556 and a package 558. The tunable bandpass filter 550 may be similar to the tunable bandpass filter 12 shown and described with reference to FIG. 1. More specifically, and in the illustrative embodiment, the tunable bandpass filter 550 may include a Micro Electro Optical Mechanical System (MEOMS) etalon fabricated on a front side of a substrate. In FIG. 15A, the back side of the substrate is shown facing up, with peripheral bond pads for the tunable bandpass filter elements positioned along two sides of the front side of the substrate.

The lead frame 552 may be fabricated so that the leads 560 are in registration with the peripheral bond pads of the tunable bandpass filter 550. FIG. 15B shows the bond pads of the tunable bandpass filter 550 bonded to the individual leads 560 of the lead frame 552. Once the bond pads on the tunable bandpass filter 550 are bonded to the corresponding leads 560 on the lead frame 552, the outer frame 562 of the lead frame 552 may be removed, as best shown in FIG. 15C. The portion of the leads 560 that extend out past the perimeter of the tunable bandpass filter 550 may provide a wire bond pad for wire bonding the tunable bandpass filter 550 to the package 558, as further described below.

The detector 554 may be similar to the detector 14 of FIG. 1. That is, the detector 554 may be formed on a substrate, and positioned adjacent the tunable bandpass filter 550 to receive one or more wavelengths that are passed through the tunable bandpass filter 550. Readout electronics 556 may also be provided. The readout electronics 556 may be fabricated on a separate substrate using conventional integrated circuit processing techniques. Metal pads (not explicitly shown) may be provided on the readout electronics substrate to provide an electrical connection to the detector 554, as further described above with respect to FIG. 1. Bump bonds, for example, may be used to electrically connect one or more electrodes of the detector 554 to corresponding metal pads on the readout electronics 556. The illustrative readout electronics 556 may also have peripheral bond pads along two sides of the readout electronics substrate, as shown.

The illustrative package 558 may have an internal cavity 566 for receiving the readout electronics 556, detector 554, lead frame 552 and tunable bandpass filter 550. FIG. 15B shows the detector 454 and readout electronics 556 secured within the internal cavity 566 of the package 558. FIG. 15B also shows the tunable bandpass filter 550 and the lead frame 552 before they are inserted into the internal cavity 566 of the package 558. In the illustrative embodiment, the bond pads on the readout electronics 556 may extend along two opposing sides of the package 558, and the bond pads for the lead frame may extend along the other two opposing sides of the package 558. Wire bond pads may be provided along an upper ledge 568 of the package 558. FIG. 15C shows the tunable bandpass filter 550 and the lead frame 552 after they have been inserted into the internal cavity 566 of the package 558. Bond wires may be provided between the bond pads on the upper ledge 568 of the package 558 to the bond pads of the lead frame and the bond pads of the readout electronics. A lid (not shown) may also be provided to seal the inner cavity of the package. In some embodiments, the lid may provide a vacuum seal.

Figure 16:
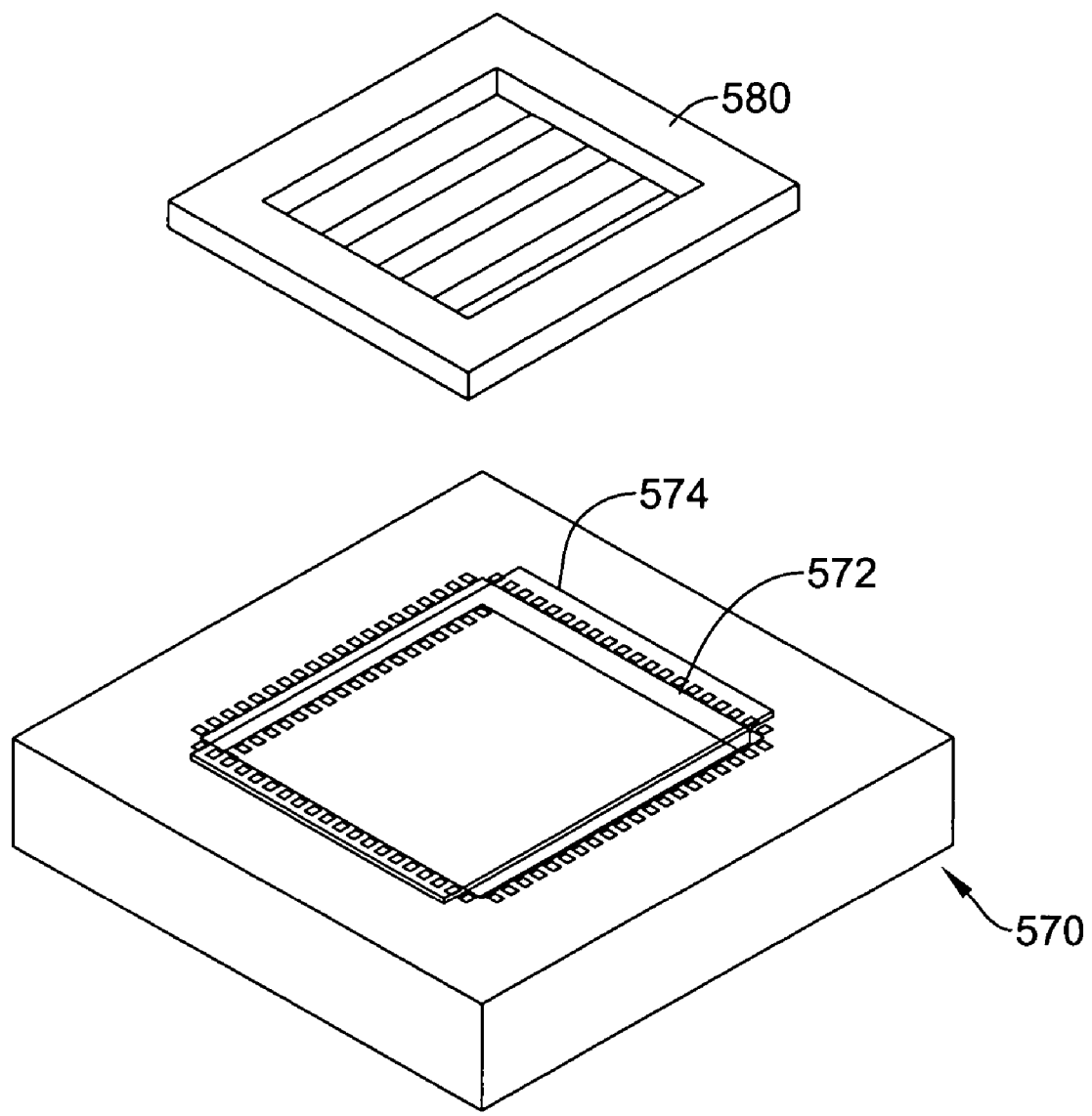
FIG. 16 is a perspective view of another illustrative assembly of a tunable bandpass filter.

FIG. 16 is a perspective view of another illustrative assembly of a tunable bandpass filter. The embodiment shown in FIG. 16 may be similar to the shown in FIGS. 15A–15C. However, the package 570 of FIG. 16 includes an inner ledge 572 and an outer ledge 574 of bond pads. The inner ledge 572 may be positioned lower than the outer ledge. Like above, the detector 554 and readout electronics 556 may be first secured in the internal cavity of the package 570. Before the tunable bandpass filter 550 is inserted, however, wire bonds or the like (not shown) may be provided to electrically connect the bond pads of the readout electronics to the bond pads on the inner ledge 572 of the package 570.

The tunable bandpass filter 550 may be secured to an inner package frame 580, rather than just a lead frame. The illustrative inner package frame 580 may have metal pads that bond to bond pads on the substrate of the tunable bandpass filter 550. The inner package frame 580 may be sized to mate within an upper opening in the top surface of the package 570. Bump bonds may then be used to bond peripheral bond pads on the inner package frame 580 to the bond pads on the outer ledge 574 of the package 570. It is also recognized that the inner package frame 580 may have the same lateral dimensions as the package 570 with interconnections along the edge of the package 570. The vertical dimensions of the package 570 may be designed to put the top substrate and bottom detector in close proximity, on the order of a few thousandths of an inch. Again, a lid (not shown) may be provided to seal the inner cavity of the package, as desired.

Figure 17:
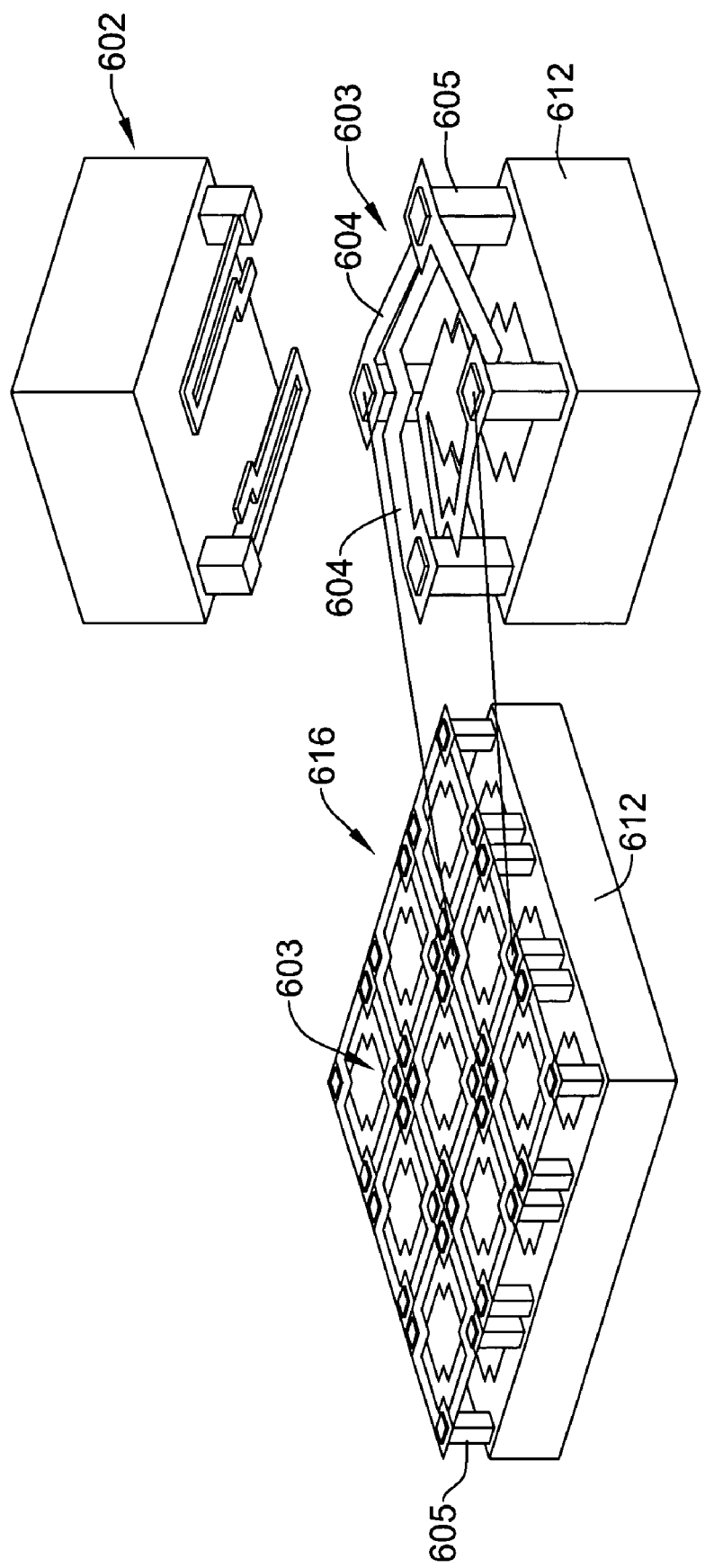
FIG. 17 shows a tunable etalon array and pixel portions of the etalon and the bolometer.

FIG. 17 shows a tunable etalon array (TEA) 616. Also shown is a micro bolometer detector array (MBDA) pixel 602 which may be positioned on a TEA etalon unit 603 upon which pixel 602 may be situated. The bolometer pixel 602 and the etalon 603 may have similar overlapping active areal footprints and use the same approximate non-active cell area for thermal isolation (bolometer) or large travel coil spring legs (etalon) 604. The cells may be aligned to micron resolution.

Figure 18:
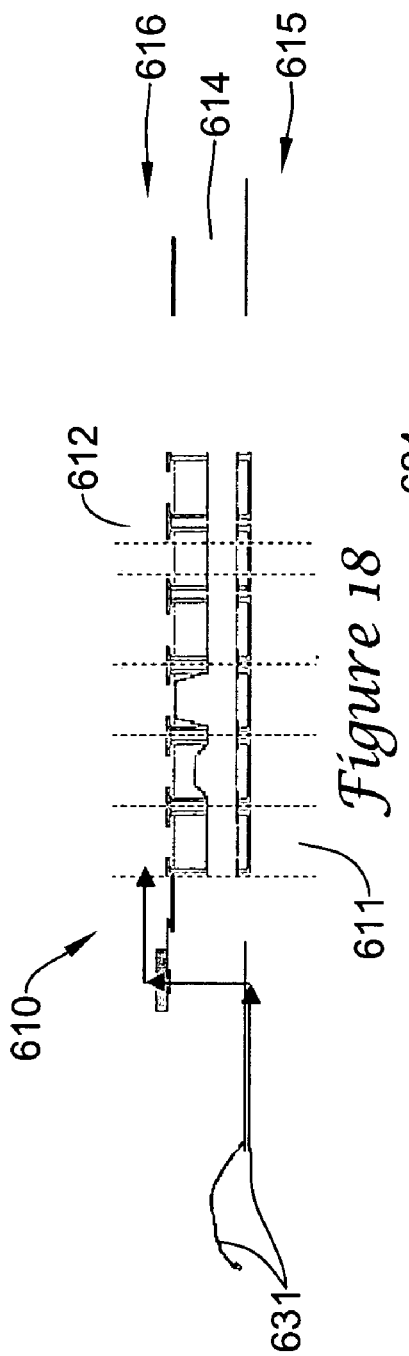
FIG. 18 shows a cross sectional schematic of the tunable microbolometer from the die perspective.
Figure 19:
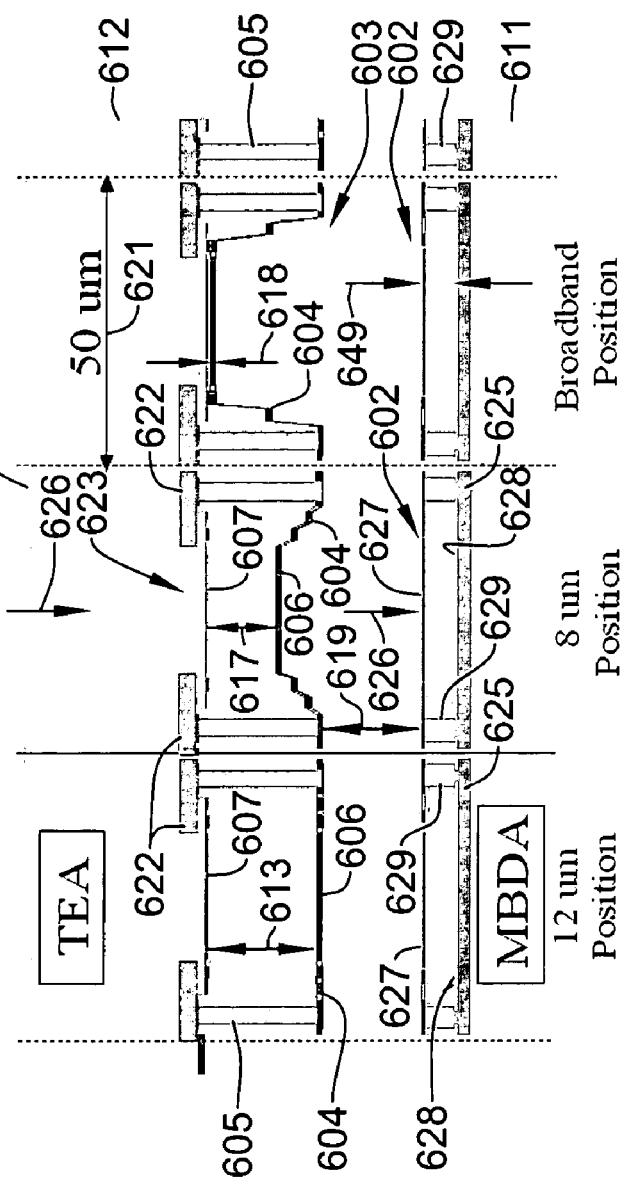
FIG. 19 shows a cross sectional schematic of the tunable microbolometer from the pixel perspective.

FIG. 18 shows a cross sectional schematic of the device 610 from the die level and FIG. 19 shows the cross sectional of the device 610 from the pixel level. A microbolometer detector array 615 and the tunable etalon array 616 may be integrated using posts of precise height as the standoffs 614. The basic functions of IR detection and IR filtering may be separated into two separated fabricated chips of arrays 616 and 615 which are precision-bonded to form the single uncooled device 610. The tunable etalon 603 may be aligned with the bolometer pixel 602 using posts, vias or standoffs 605 to hold components 602 and 603 in their appropriate positions. The aligned pixel 602 and tunable etalon 603 combination adjustment or tuning may be actuated with an etalon leg 604 pull down capacitor having effective plates 606 and 607 to a selected wavelength sensing position. Plate 606 may also be the etalon membrane mirror 606 (which may be Si or Ge materials of quarter wave thickness) and plate 607 may be etalon mirror (of $Y_2O_3$/Ge materials). There may be signal routing into arrays 615 and 616 via leads 631.

The LAMBDA device 610 may consist of bolometer array 615 and an etalon array 616 that are aligned horizontally to better than a micron, a small percentage of the 50 micron pitch. The vertical separation may be maintained by NiFe spacers 614 on the periphery of the die, which may be formed using a MEMS electroplating technology. Spacers 614 may hold etalon substrate 612 and bolometer substrate 611 in place relative to each other being attached with thin film solder applied to the spacer. Also, shown in FIG. 19 are etalons 603 in three different actuation modes, 12 microns, 8 microns, and broadband IR. Distance 613 between mirrors 606 and 607 may be for the 12 micron tuning. Distance 617 may be for the 8 micron tuning, which is also exhibited in etalon 603 of FIG. 17. Distance 618 may be negligible for the broadband tuning. The etalon-bolometer gap 619 may be about 10 microns. Etalon 603 and pixel 602 pitch or distance 621 of device 610 may be about 50 microns. Etalon CMOS electronics 622 on substrate 612 have IR opening 623 for entry of IR light 626 through an Si AR coating 624, substrate 612, and mirrors 606 and 607 onto bolometer pixel 602. The active area or fill factor may be about 60 percent of the cell area of etalon 603. Light 626 may impinge bolometer layer 627 and bolometer reflector 628. The gap between layer 627 and reflector 628 may be about 2.5 microns. That gap may be supported by posts or wall 629. Bolometer CMOS electronics 625 may be situated on Si substrate 611. Signals may be multiplexed into device 610 via leads 631.

The LAMBDA etalon 603 and pixel 602 may be optically coupled. Interferometric modeling and ray tracing may show that the optimum bolometer pixel gap between layer 627 and reflector 628 for LAMBDA may be about 2.5 microns (whereas the normal bolometer gap may be about 1.8 microns). This may be achieved by increasing the thickness of the polyimide sacrificial layer and accordingly increasing the depth of the pixel contact vias down to the substrate electronics.

Figure 20:
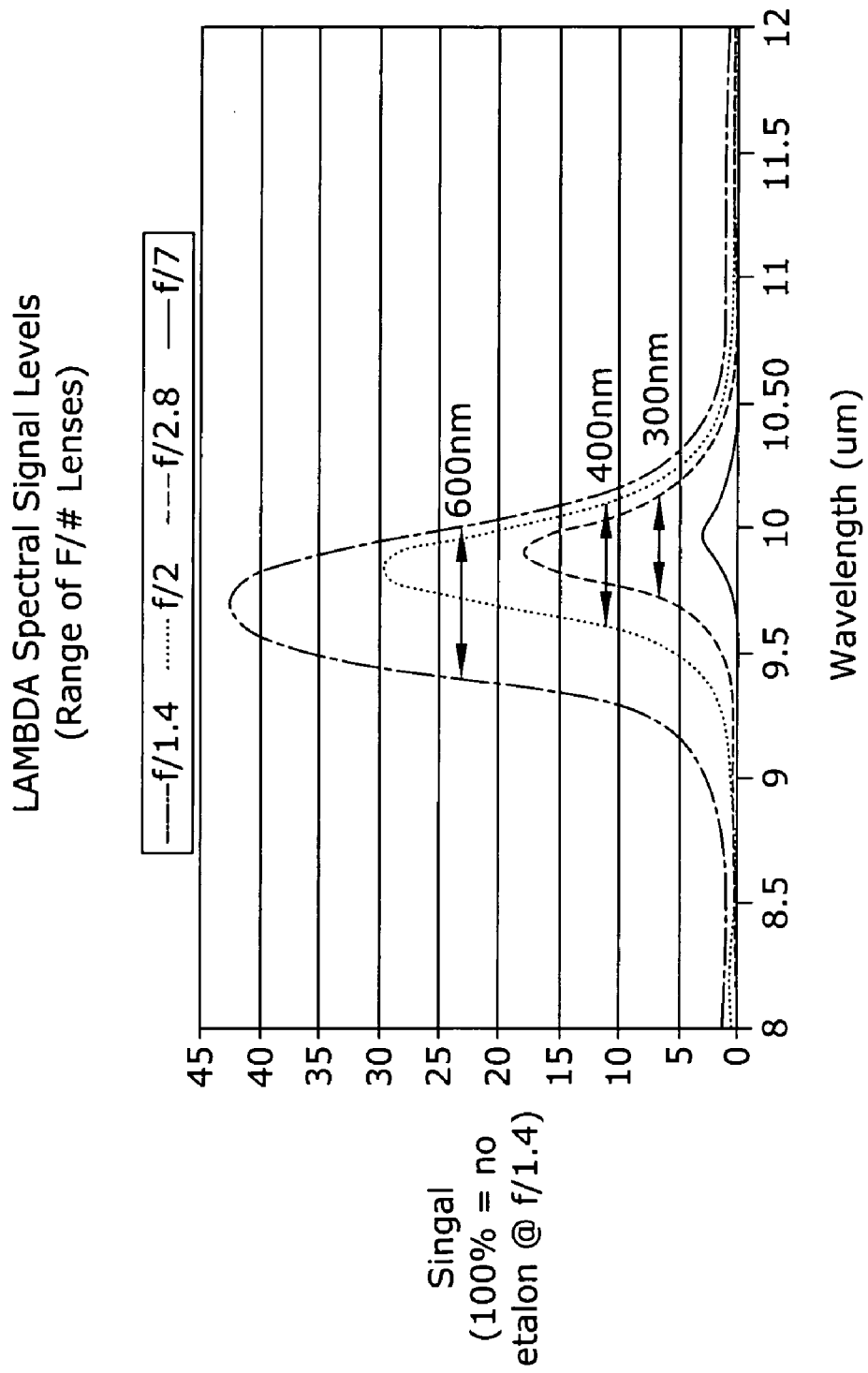
FIG. 20 shows the etalon performance in a camera for a range of F stops versus the relative signal strength.

FIG. 20 shows the etalon performance in a camera for a range of F/#s with the vertical scale representing the relative signal strength. It reveals the etalon characteristics using $Y_2O_3$ and Ge mirrors for various F/# lenses. To evaluate the LAMBDA optical performance, the IR camera lens cone angle and field-of-view should be included in the model. Initial ray tracing appears to indicate that optical performance is maintained for the fields-of-view used in typical uncooled bolometer applications. Off-axis cone rays may shift the center-of-gravity of the spectra to shorter wavelengths, and broaden the FWHM, as shown in FIG. 20; but all these effects may be calibrated into the camera operation. As the lens F/# becomes larger, more light reaches the MBDA detector but the resolution is decreased, although always at acceptable levels. There may be a range of modes of LAMBDA operation depending in source intensity and desired spectral resolution ranging extending down to approximately 10 LWIR bins.

To achieve TEA etalon 616 operation across the whole 8–12 micron band, it may be necessary to maximize the free spectral range. The use of very high index and very low index films may provide this range. Germanium with an index of 4.1 is a good optical material that may be sputter deposited onto the low index material. The low index material choices may include $Y_2O_3$ (n=1.5), ZnS(n=2.2), ZnSe (n=2.4), $MgF_2$ (N=1.35), and $AlF_3$ (n=1.30). Most attractive in this group appears to be $Y_2O_3$. While not having zero absorptance in the LWIR, its placement in the optical cavity in thin film form suggests that its absorptance is only one percent, very minimally degrading etalon operation. Other low index thin films may be more characteristic IR materials but do appear to have the vacuum integrity and processability of oxides. To achieve the desired electrical performance and provide a bottom capacitor, thin films of HfN may be deposited, and capped with a thin dielectric to avoid shorting. The electrodes need not be in the etalon optical cavity but are only on the non-optical leg springs 604. Should it be necessary to have conductors in the main active pixel region for stronger pull-down, HfN films having about 1000 Ohm/sq resistance and being transparent in the IR spectrum may be used. Hafnium nitride may provide an IR transparent electrode much like indium tin oxide does in the visible spectrum. On top of these films may be the films forming the etalon 603 structure. The sacrificial film may be a 10 micron thick layer of photoresist. On top of that may be deposited a 630 nm film of silicon. Silicon with a refractive index of 3.4 may form a mirror of the proper reflectance to achieve a modest finesse etalon in conjunction with the bottom Ge/$AlF_3$ mirror. The top electrode formed on the Si or on Si passivated with a thin layer of $SiO2$ may also be sputtered HfN films. The HfN film may extend down the legs 604 that provide the electrostatic actuation down to a via contact extending down the bottom Si wafer 612 and the TEA etalon control electronics 622.

Figure 21:
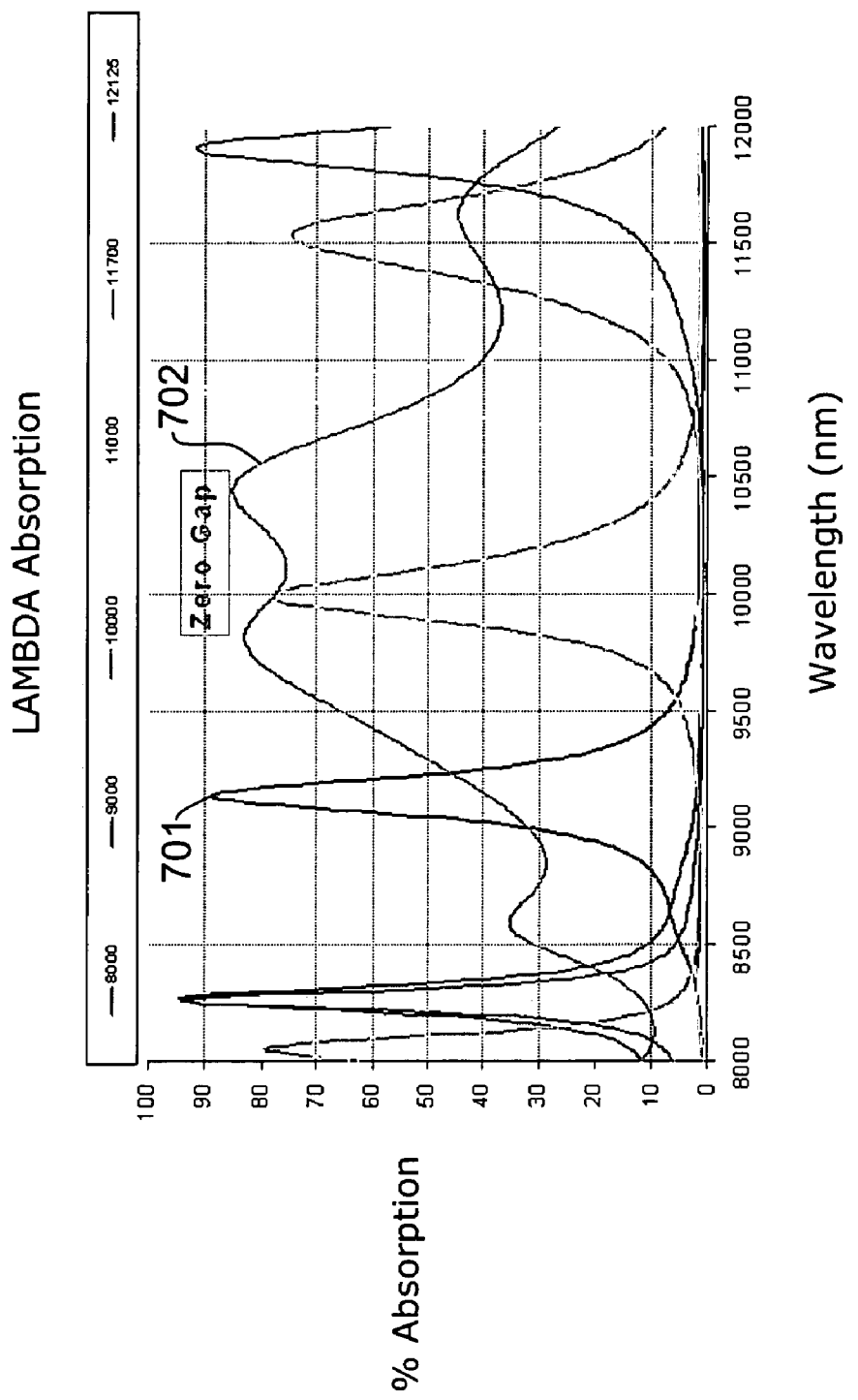
FIG. 21 is a graph revealing the percent absorption versus wavelength of spectral and broadband aspects of the tunable bolometer.

The TEA pixels 603 may be tunable over the full LWIR band. When the TEA control voltage is increased further, the etalon 603 may move to a "zero gap" position and provide broad-band operation. The etalon mirror 606 need not physically come in contact with the bottom mirror 607 to achieve broad band performance, so anti stiction stops are possible. If the distance between the actuator element 606 and the mirror 607 is less than 20 nm, broad band performance will be obtained. The average broad band performance at "zero" gap may be about 51 percent. This compares with about 85 percent average LWIR absorptance for a standard microbolometer. It can be seen from FIG. 21 shows calculated LAMBDA device 610 optical performance in tuning mode 701 and broadband mode 702. The graph reveals the percent absorption versus wavelength of spectral and broadband aspects of the tunable bolometer 610.

Figure 22:
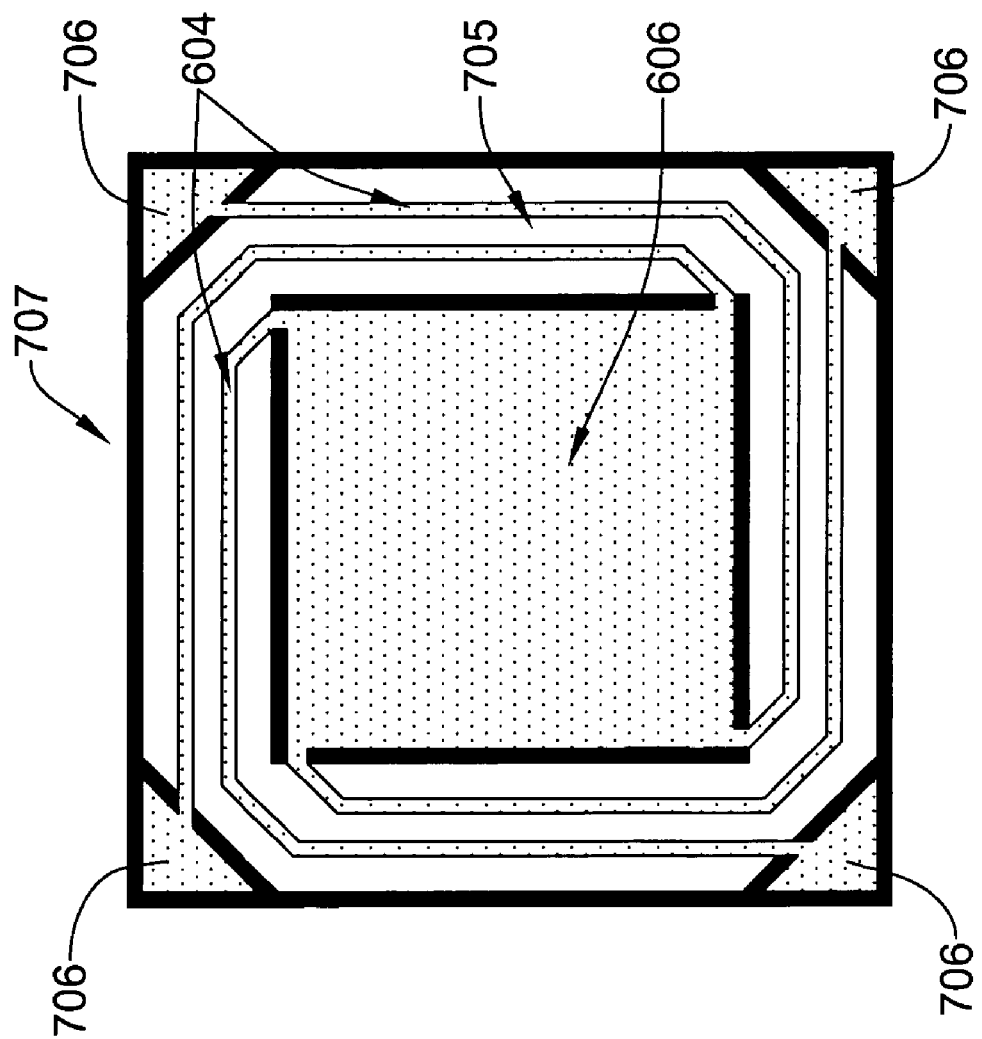
FIGS. 22 and 23 show plan and perspective views of an etalon actuator.
Figure 23:
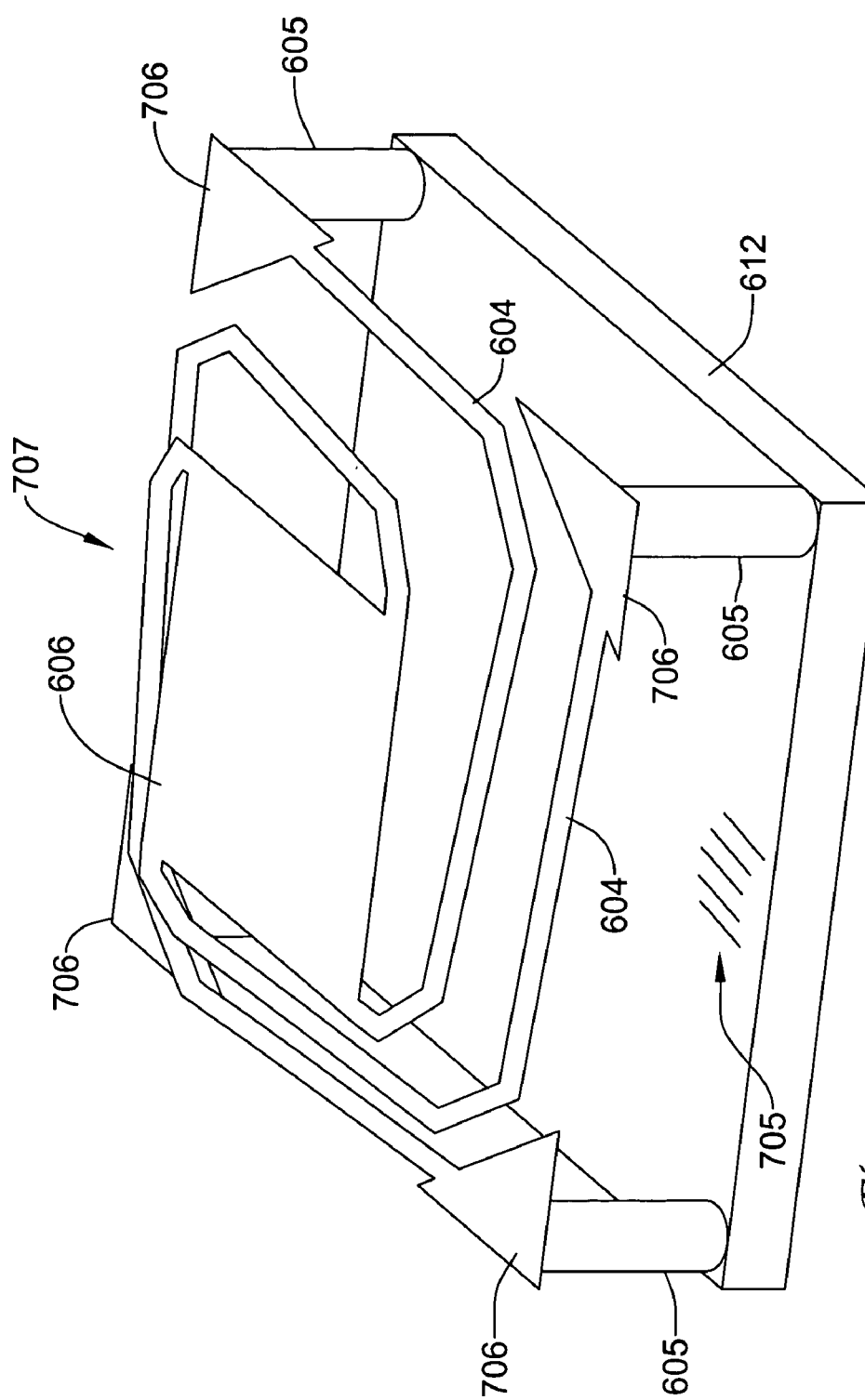

FIGS. 22 and 23 show plan and perspective views of an etalon actuator 707. The actuators 707 for the LAMBDA may have long, thin silicon legs 604 anchored at their corners 706 about ten microns above the surface of the etalon wafer 612. These corners 706 may be on support posts 605. The legs 604 may be electrostatically attracted to high-voltage electrodes 705 on or under the surface of the wafer 612. The etalon mirrors 606 of the actuator 707 may also be made from silicon.

Actuator 707 may enable several microns of vertical travel with voltages of less than 100 volts. Actuator 707 may be made on top of CMOS wafers 612 using conventional MEMS process steps. A wafer 612 containing many actuators 707 may be bonded under vacuum to a wafer containing many bolometer arrays 615, resulting in a vacuum package.

In a simulation, the legs 604 may be 5000 angstroms thick, the initial gap may be 10 microns, and with 100V applied voltage the etalon mirror may move 1.8 microns. Maximum (von Mises) stress may be about 122 MegaPascals. For further optimization, the silicon legs 604 may be made thinner.

Possible stiction and reproducibility may be minimized with several design features. One feature may include actuating beneath the legs 604 and not beneath the mirror 606 itself, which may result in about a one micron gap between the legs 604 and the electrodes 705 after pull-in, and about a 300 angstrom gap between the mirror 606 and the bulk silicon wafer 612. With this feature, full-range actuation may be enabled, stiction minimized, and broadband transmission occurring when the mirror 606 is at its lowest, most stable location, towards wafer 612. Another feature may include using a single material (silicon) for the legs 604 and the mirror 606 to minimize sensitivity to small thermal fluctuations and maximize long-term stability. Tunable range may be made greater than the typical value (i.e., greater than one-third of the initial gap) by the "lever action" of the electrode geometry. By surrounding each pixel 603 with an electrostatically-grounded metal wall, electrostatic interaction between neighboring TEA pixels may be eliminated. If there is no silicon nitride on the actuator 707 wafer 612, and silicon dioxide is only below (not above) the high voltage electrode 705, there may be little or no trapped charge in the dielectrics, and thus little or no tendency for actuation irreproducibility to become a problem.

Since the actuator 707 stresses may be low, the restoring forces of the spring of legs 604 should be low. The reduction of stiction effects may be effected with the following features. First, one may actuate from the periphery, not from beneath the mirrors 606 themselves. The actuation electrodes 705 may be recessed so that the arms 604 (the surfaces being electrostatically attracted) do not come in contact with the high-voltage drive electrodes 705. Topography may be introduced at the edges of the recesses so that the arms 604 are highly stressed as they come into contact with the points of topography. The high stress may make it energetically favorable for the device 707 to overcome stiction. Low surface energy coatings may be added to the etalons 603 to reduce/eliminate stiction. Such an organic coating may also serve as a passivation layer to ensure long term stability of surface characteristics. The coating may be extremely thin, so that the effect on optical performance of device 610 can be neglected.

The TEA actuator may have approximately 40 to 60 percent optical fill factor. This may be due to the obscuration caused by the CIC FET area of CMOS electronics 622, the row and control metallizations, and the actuator "leg" 604 area, which may be combined to leave only the central TEA pixel 603 area transparent to IR radiation 626. The principal limitation on optical throughput may be the area required by the electrostatic actuators. The total fill factor may be limited by the optical fill factor of the TEA pixel 603, and not necessarily by the fill factor of the bolometer pixel 602 which may typically be about 70 percent.

The LAMBDA device 610 may be fabricated by combining several processing skills. Each device 610 may be built from two chips, the MBDA (microbolometer detector array) 615 and the TEA (tunable etalon array) 616. The MBDA 615 may be a slightly modified microbolometer array, and the TEA 616 may have an array of pixilated tunable IR filters which are electrostatically actuated. The two chips 615 and 616 may be attached together facing each other pixel-to-pixel. The size of LAMBDA 610 may one or several pixels or it may 16×16, 60×80, 120×160 or larger depending on its planned application.

The MBDA fabrication may be for a significant portion built on the established baseline microbolometer process steps, with the exception of a modified pixel-to-substrate gap 649, and bonding/connecting attachment points for the TEA chip 616. The attachment points are simply solderable metal landing sites for solder capped pillars 614 on the TEA chip 616. The attachment points may also be electrical interconnects which allow the transfer of control electronics to pads on the MBDA chip 615.

Figure 24A:
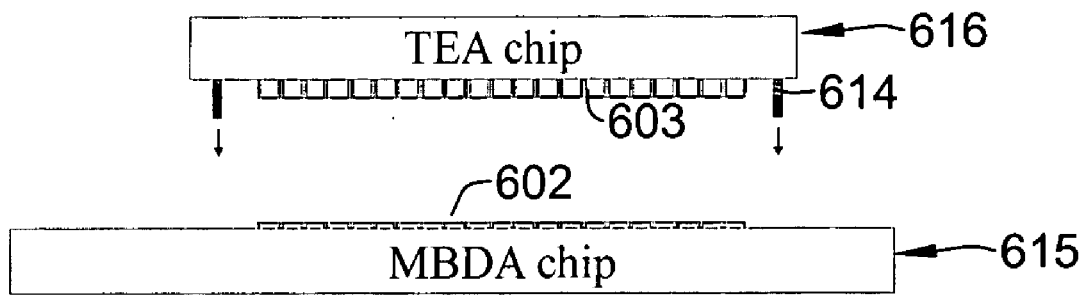
FIGS. 24A, 24B and 24C show the steps of the etalon and bolometer chip alignment, binding and light reception, respectively.
Figure 24B:
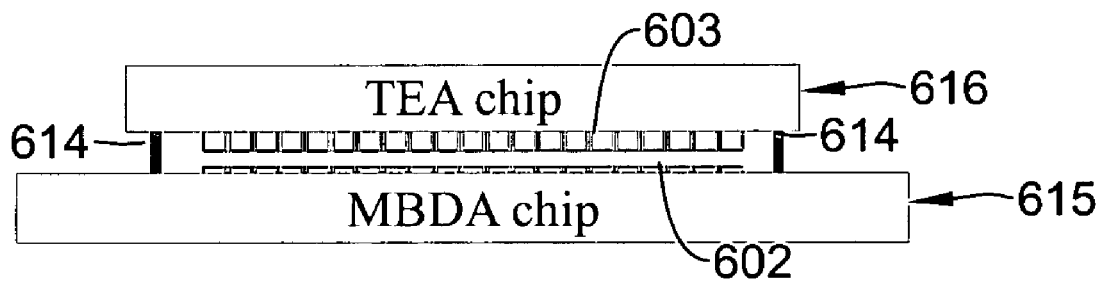
Figure 24C:
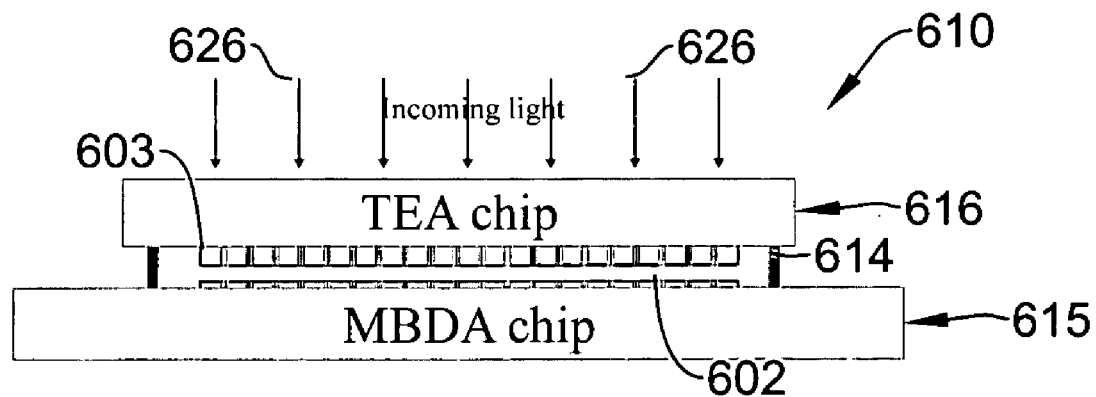

The completed TEA chip 616 may be attached to a completed MBDA chip 615 at the die level to allow maximum iterations. Production bonding might be better done at a wafer level for low unit cost. FIGS. 24A, 24B and 24C indicated a LAMBDA fabrication sequence. In FIG. 24A, the TEA chip 616 is shown positioned above and aligned with MBDA chip 615. In FIG. 24B, the TEA chip 616 may be attached to MBDA chip 615 via support posts 614. In FIG. 24C, operation involves incoming light 626 coming down into chip 616. In the full down position for the TEA pixels 603, the MBDA 615 may have a broadband view. Intermediate TEA pixel 603 positions may present specific spectral content to the MBDA pixels 602.

Figure 25A:
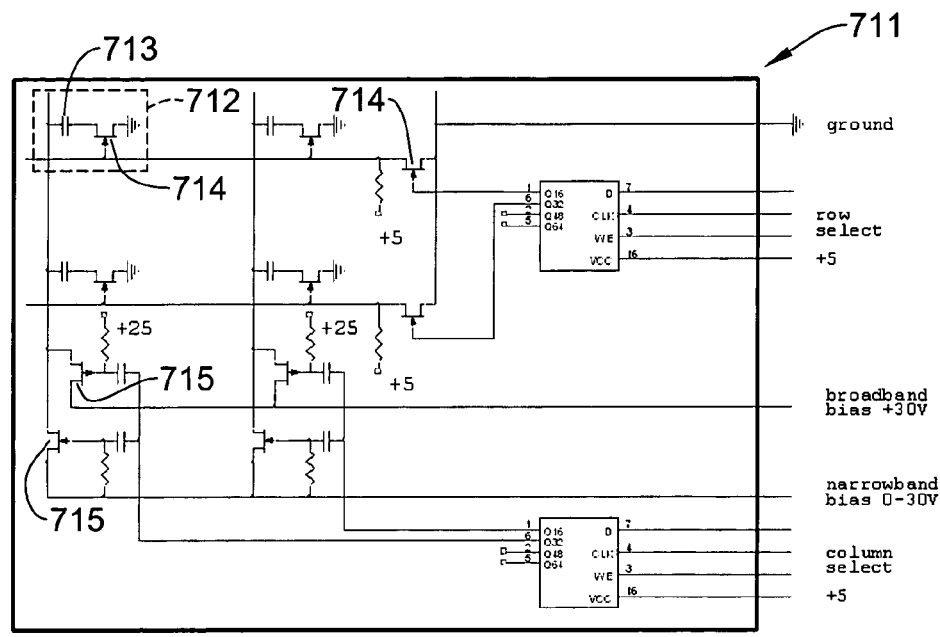
FIGS. 25A and 25B are schematics of the etalon actuator addressing and bandwidth selection and of the actuator unit cell, respectively.
Figure 25B:
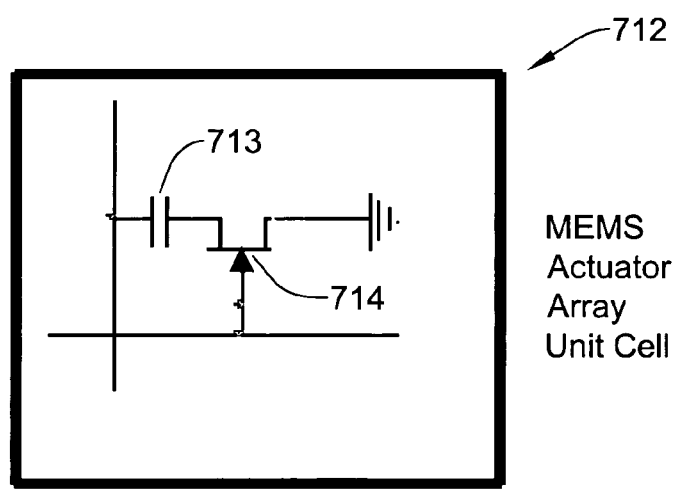

The LAMBDA may use integrated control/addressing/readout electronics 711, as shown in FIG. 25A, for the TEA 616 and a version of it the MBDA 615. Electronics 711, as shown, may be used for a LAMBDA 610 etalon addressing circuit. Only two rows and columns are shown for clarity and example. Circuit 712 of FIG. 25B may represent the electronics for a MEMS actuator 707 array unit cell. The integrated circuits of electronics 711 may be monolithically integrated into each chip 615 and 616, respectively. This may allow a conventional low-voltage CMOS FET process (12V) to be used for the microbolometer array 615 read out (RO) IC and a high voltage (90V) CMOS FET process to be used for the TEA 616. When the two components 615 and 616 are bonded, electrical interconnections may be formed between the two circuits, so that the two circuits can operate in synchronism, and all gold bonds can be made to the bolometer array 615. The ROIC for the bolometer array 615 may follow established principles, except that layout and shielding metallizations may be designed to minimize transient capacitive pickup from high voltage switching events in the TEA 616. The bolometer 615 ROIC principles and circuitry may be developed.

As to the TEA 616 control circuit, two dimensional arrays of electrostatic actuators 707 may be controlled by an addressing/control circuit 711 similar to that shown in FIG. 25A. The pixel unit cell circuit 712 of FIG. 25B may consist of one actuator 707 (shown as a capacitor 713) and one FET 714. All other components shown in FIGS. 25A and 25B may be at the periphery of the array 616, and be used to control the voltages on each row and column of the array using the 8-bit row and column address generators. The action of the circuit 717 is to place the input analog voltages "broadband bias" (fixed) and "narrowband bias" (variable) on any selected actuator 707 in the array 616. Variation of the narrowband bias voltage may tune the pixels 603. The unit cell is very simple because it may be desirable to minimize obscuration of IR radiation 626 in the pixel 603 unit cell. All other CIC components may be at the periphery of the array, where space for components is freely available. As to the operation of the circuit 717, it may be noted that any row of actuators 707 (capacitors 713) can be grounded or floated by the row-control peripheral FETs 714. Similarly any column of actuators 707 may be brought to any desired potential by the peripheral column control FETs 715. This may allow any desired charge (i.e., differential voltage) to be placed on any actuator 707, and be isolated so that it remains trapped. These trapped charges may need to be refreshed at some interval (estimated to be a few seconds) due to current leakages, e.g., via FET leakage currents. Repeatedly addressing pixels 603 in this manner may allow the tuning voltage on any pixel to be rapidly adjusted much faster than a frame time. All FETs may operate digitally (i.e., as on/off switches).

Figure 26:
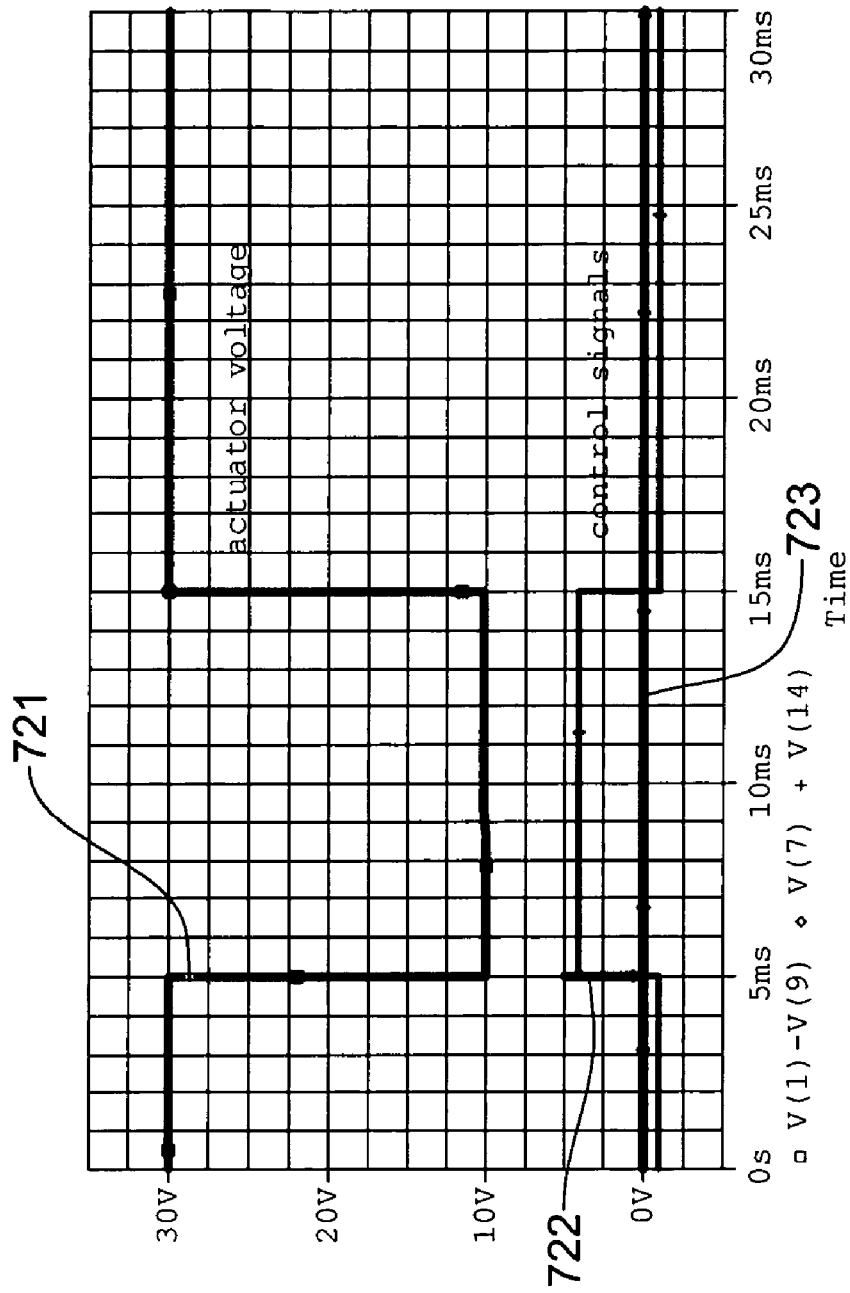
FIG. 26 is a graph of a simulation of the operation of the circuit for selection of broadband and narrow band actuator positions.

FIG. 26 shows a SPICE simulation of the operation of the circuit 711 in FIG. 25A, showing the voltage 721 across an electrostatic actuator 707 being switched between broadband bias (taken to be 30V) and narrow band bias (taken to be 10V). The switching times from 30V to 10V (volts) may take place at time=5 msec. The charge may then be left trapped until time=15 msec, when the voltage is reset to 30V. Actuator 707 may be commanded to switch from 30V (Broadband bias) to 10V (narrowband bias) for 10 msec. Controllable switching between broadband and narrowband operation may be possible on an individual pixel basis at a 30 Hz framerate without loss of bolometer performance. Row and column control signals 722 and 723 are also shown (lower) in FIG. 26. Actuator 707 control voltages may need to be as high as about 90V so FET 714 may be designed to operate at such voltages.

Figure 27:
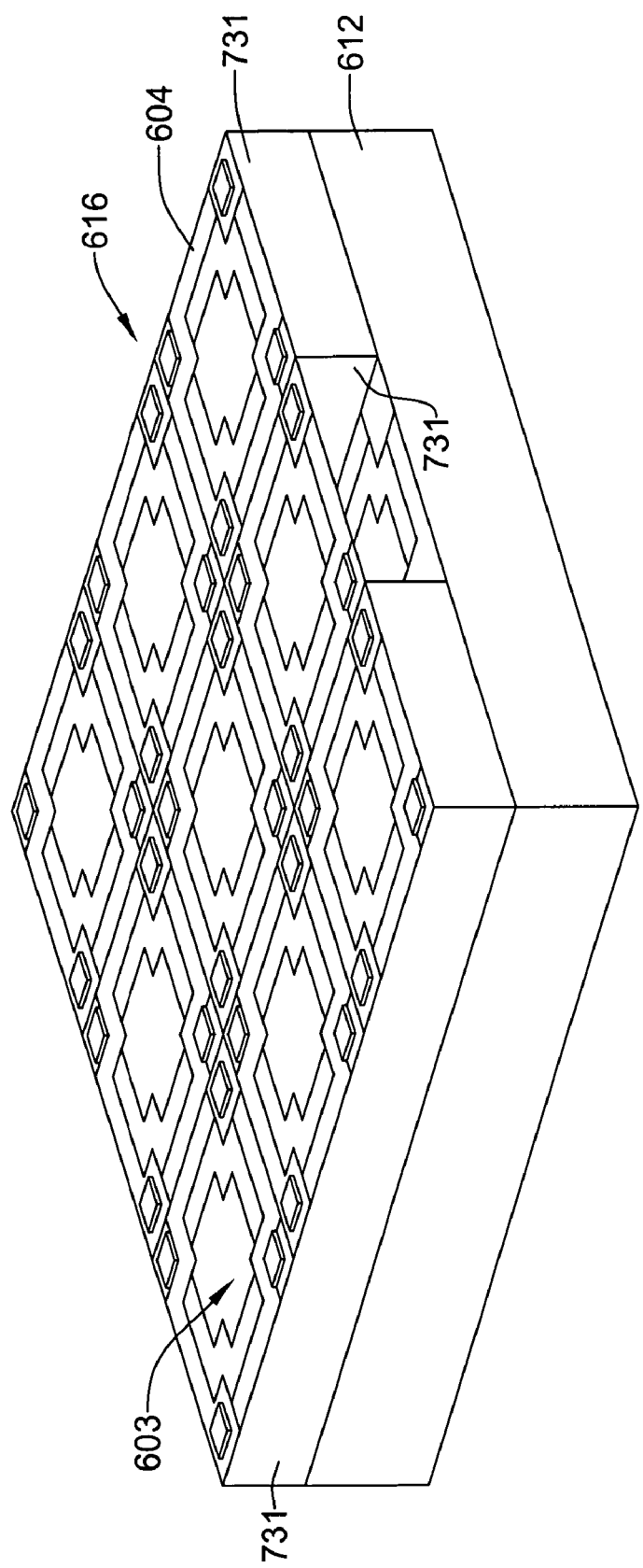
FIG. 27 is a perspective view of an etalon array having ridges for supporting the etalons at the pixel level.
Figure 28:
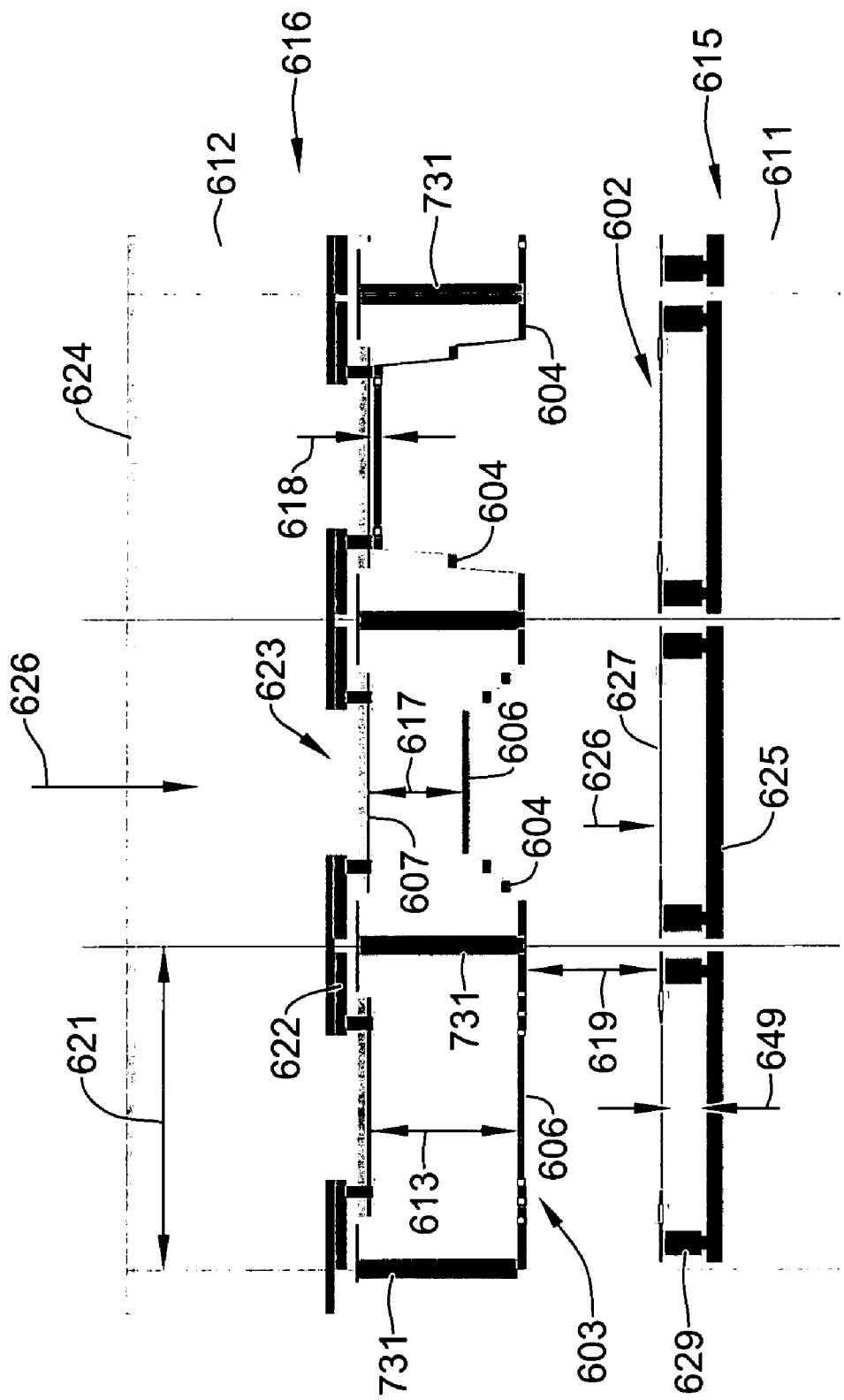
FIG. 28 is a cross section view of a portion of an etalon array having ridges for supporting the etalons.

An alternate design in FIG. 27 for supporting LAMBDA etalons 603 at the pixel level may use ridges 731 rather than posts 605 as shown in FIG. 17. In both cases, the top mirror 606 electrode may be at ground and the voltage may be applied at the CMOS 622 high voltage electrode 705 to actuate the leg 604 electrodes and achieve a pull down of the TEA mirror 606. The post 605 structure appears appealing because it is fairly open and thus should be easy to remove the sacrificial polyimide layer by dry plasma etching. On the other hand, a ridge structure 731 may shield each pixel 603 from its adjoining neighboring pixel 603 and reduce the degree of cross talk between capacitors 713 shown in FIGS. 25A and 25B. This may be especially important since the pull-down capacitors 713 are in the flexible leg 604 structure at the pixel 603 edge. Ridges 731 may be conductors. FIG. 27 has a pixel 603 removed to illustrate the internal structure of ridges 731. FIG. 28 is a cross section of the LAMBDA system 610 having TEA 612 with ridges 731. There appears one common barrier 731 at the etalon pixel 603 edge. Etalon mirror positions 613, 617 and 618 represent the 12 micron, 8 micron and broadband positions, respectively. The other reference numerals may be identified in the description of FIG. 19 showing the post 605 version of TEA 612.

Figure 29:
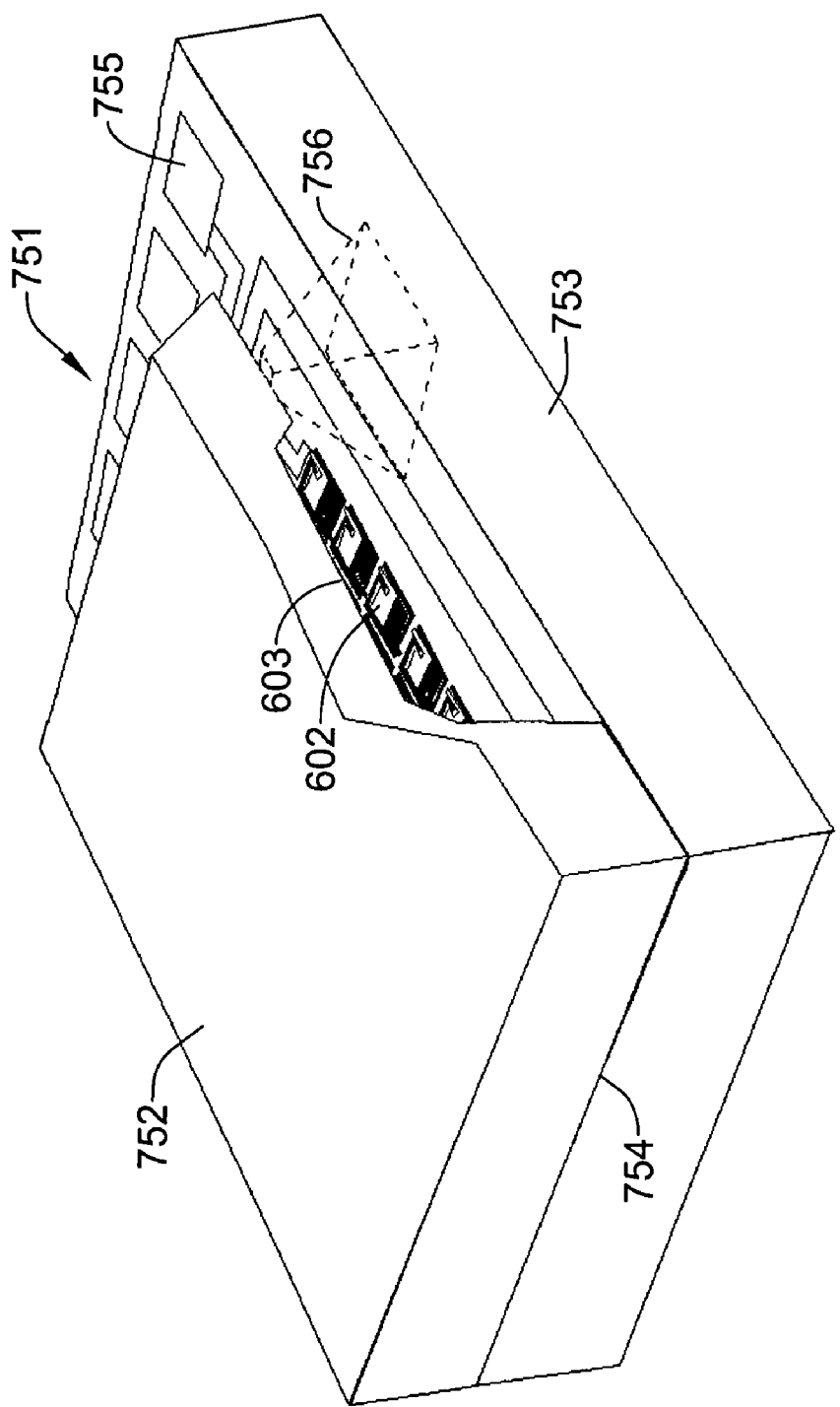
FIG. 29 show an integrated vacuum package for the tunable bolometer.

An integrated vacuum package (IVP) 751 of FIG. 29 may be used to encompass LAMBDA 610. The TEA array 616 can form the topcap 751 of IVP 751. The base 753 contains the MBDA 615 having bolometer pixels 602 as shown with the cut-away portion of topcap 752. Topcap may be bonded to the base 753 at a meeting place 754 of the surfaces of topcap 752 and base 753. Input/output gold pads 755, situated on wafer 753 in the cutout area of the topcap 752, may provide the external electrical connections for LAMBDA 610. There may be an anti-reflective (AR) coating 624 on the IR transparent topcap 752. Substrate 612 along with the other parts of TEA 616 may also be part of topcap 752. Similarly, MBDA 615 is integral to base 753.

The silicon IVP 751 process may result in a low-cost lightweight (0.2 gram) compact vacuum package by a wafer-scale process. The IVP process may basically consist of bonding a silicon "topcap" wafer 752 to the base wafer 753, to produce a bonded double-wafer with multiple arrays protected in individual vacuum packages. The double-wafer may be easily handled without damage to the protected arrays, and diced into individual dies using normal silicon dicing techniques. An etched evacuation via 756 may be placed in one of the wafers, such as the MBDA wafer 753, to enable wafer assembly, bonding, pumping, getter firing, baking and sealing to be performed in separate stages, at their different optimum times and temperatures.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. An adaptive sensor comprising:
a plurality of detectors; and
wherein:
each detector comprises an adjustable filter; and
each adjustable filter is adjustable independent of an adjustment of another filter of a detector of the plurality of detectors.

2. The sensor of claim 1, wherein the plurality of detectors is situated in a sealed package.

3. The sensor of claim 2, wherein each detector further comprises an actuator connected to the adjustable filter.

4. The sensor of claim 3, wherein the actuator is an electrostatic actuator.

5. The sensor of claim 3, wherein each detector is an infrared light detector.

6. The sensor of claim 5, wherein the adjustable filter is a variable bandpass filter for infrared light.

7. The sensor of claim 5, wherein the adjustable filter is for selecting a bandpass mode for infrared light.

8. The sensor of claim 5, wherein each detector of the plurality of detectors is a bolometer.

9. The sensor of claim 2, wherein the adjustable filter is adjustable for selecting a wavelength from a plurality of wavelengths of light.

10. The sensor of claim 9, wherein each adjustable filter is a Fabry-Perot filter.

11. The sensor of claim 1, wherein the plurality of detectors is situated on a first wafer.

12. The sensor of claim 11, further comprising a second wafer, wherein the second wafer is a topcap situated on the first wafer thereby enclosing the plurality of detectors.

13. The sensor of claim 12, wherein the first and second wafers form an integrated vacuum package.

14. The sensor of claim 13, wherein the topcap comprises a light transmissive window.

15. A means for detecting comprising:
a means for detecting light; and
wherein:
the means for detecting light comprises a plurality of detectors;
each detector of the plurality of detectors comprises a variable wavelength filter; and
the variable wavelength filter is adjustable independent of a variable filter of another detector of the plurality of detectors.

16. The means of claim 15, wherein the each detector comprises an actuator connected to the variable filter.

17. The means of claim 16, wherein the actuator is a capacitive actuator.

18. The means of claim 15, wherein the variable filter is adjustable to a narrow bandpass at a wavelength of light.

19. The means of claim 18, wherein the wavelength of light is selectable from a range of wavelengths between about one micron and thirteen microns.

20. The means of claim 15, wherein the means for detecting light is situated in a sealed enclosure.

21. A method for detecting comprising:
providing a plurality of detectors;
wherein:
each detector of the plurality of detectors comprises an adjustable light filter; and
the filter is adjustable to a desired wavelength independently of at least another filter of a detector of the plurality of detectors.

22. The method of claim 21, further comprising situating the plurality of detectors in a sealed enclosure.

23. The method of claim 22, wherein the filter is electrostatically adjusted.

24. The method of claim 21, wherein the filter is attached to at least one leg spring for adjustment relative to an electrostatic force.

25. The method of claim 21, wherein the filter may be selectively adjusted to a wavelength of an infrared spectrum.

26. A sensor comprising:
an array of detectors; and
wherein:
each detector of the array of detectors comprises a tunable etalon; and
the etalon is tunable to desired band of light for a detector of the array of detectors independently of another tunable etalon of a detector of the array of detectors.

27. The sensor of claim 26, wherein the array of detectors is enclosed in a hermetically sealed package.

28. The sensor of claim 27, wherein the hermetically sealed package comprises:
a topcap; and
a base; and
wherein the topcap is bonded to the base.

29. The sensor of claim 28, wherein the topcap and base are bonded on a die-to-die basis.

30. The sensor of claim 26, wherein the etalon comprises an actuator to tune the etalon.

31. The sensor of claim 30, wherein the actuator operates according to an electrostatic force.

32. The sensor of claim 26, wherein the etalon is situated on a set of leg springs for movement for tuning.

33. The sensor of claim 26, wherein the etalon is tunable to a wavelength of a plurality of wavelengths of light.

34. The sensor of claim 33, wherein:
the detector is a bolometer; and
the etalon is a Fabry-Perot etalon.

35. An adaptive sensor comprising:
a plurality of detectors; and
wherein:
each detector comprises an adjustable filter and an actuator connected to the adjustable filter; and
each adjustable filter is adjustable independent of an adjustment of another filter of a detector of the plurality of detectors.

* * * * *